(12) United States Patent
Cho et al.

(10) Patent No.: US 12,557,362 B2
(45) Date of Patent: Feb. 17, 2026

(54) SEMICONDUCTOR DEVICE INCLUDING SOURCE/DRAIN PATTERN WITH VARIED GERMANIUM CONCENTRATIONS

(71) Applicant: SAMSUNG ELECTRONICS CO., LTD., Suwon-si (KR)

(72) Inventors: Namkyu Cho, Suwon-si (KR); Jungtaek Kim, Suwon-si (KR); Moon Seung Yang, Suwon-si (KR); Sumin Yu, Suwon-si (KR); Seojin Jeong, Suwon-si (KR); Seokhoon Kim, Suwon-si (KR); Pankwi Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 377 days.

(21) Appl. No.: 18/100,872

(22) Filed: Jan. 24, 2023

(65) Prior Publication Data
US 2023/0402510 A1   Dec. 14, 2023

(51) Int. Cl.
| H10D 62/832 | (2025.01) |
| H10D 30/69 | (2025.01) |
| H10D 62/822 | (2025.01) |
| H10D 84/03 | (2025.01) |

(52) U.S. Cl.
CPC ......... *H10D 62/832* (2025.01); *H10D 30/797* (2025.01); *H10D 62/822* (2025.01); *H10D 84/038* (2025.01)

(58) Field of Classification Search
CPC ............ H10D 30/797; H10D 30/6757; H10D 84/038; H10D 62/822; H10D 62/832; H10D 64/256; H10D 30/43
See application file for complete search history.

(56) References Cited

U.S. PATENT DOCUMENTS

| 6,713,359 B1 | 3/2004 | Mizushima et al. |
| 6,831,292 B2 | 12/2004 | Currie et al. |
| 8,154,050 B2 | 4/2012 | Sudo |
| 8,278,177 B2 | 10/2012 | Shimamune et al. |
| 9,691,898 B2 | 6/2017 | Sung et al. |
| 10,510,889 B2 | 12/2019 | More et al. |
| 10,658,510 B2 | 5/2020 | Liu et al. |

(Continued)

FOREIGN PATENT DOCUMENTS

| JP | 5018473 B2 | 9/2012 |
| KR | 10-0798814 B1 | 1/2008 |

*Primary Examiner* — Changhyun Yi
(74) *Attorney, Agent, or Firm* — Sughrue Mion, PLLC

(57) ABSTRACT

A semiconductor device includes a substrate including an active pattern, a channel pattern on the active pattern, and a source/drain pattern on a side surface of the channel pattern, the source/drain pattern including a first section between a first level and a second level that is higher than the first level, a first variation section between the second level and a third level that is higher than the second level, and a second section between the third level and a fourth level that is higher than the third level, where a rate of change in germanium concentration in the first variation section in a first direction is greater than a rate of change in germanium concentration in each of the first section and the second section in the first direction, and a germanium concentration at each of the first level and the second level is greater than 0 at % and equal to or less than 10 at %.

19 Claims, 21 Drawing Sheets

(56) References Cited

U.S. PATENT DOCUMENTS

2008/0067609 A1    3/2008  Kim et al.
2018/0175195 A1*  6/2018  Huang .............. H01L 21/02532
2021/0288151 A1    9/2021  Chang et al.

* cited by examiner

SEMICONDUCTOR DEVICE INCLUDING SOURCE/DRAIN PATTERN WITH VARIED GERMANIUM CONCENTRATIONS

CROSS-REFERENCE TO RELATED APPLICATIONS

This application is based on and claims priority to Korean Patent Application No. 10-2022-0071650, filed on Jun. 13, 2022, in the Korean Intellectual Property Office, the disclosure of which is incorporated herein by reference in its entirety.

BACKGROUND

The present disclosure relates generally to a semiconductor device and a method of manufacturing the same, and more particularly, to a semiconductor device including a field effect transistor and a method of manufacturing the same.

Semiconductor devices may include integrated circuits including metal-oxide-semiconductor field effect transistors (MOSFETs). As sizes and design rules of semiconductor devices have been reduced, MOSFETs have been scaled down. Operating characteristics of semiconductor devices may be deteriorated by reduction in size of MOSFETs. For example, in a related art eSiGe, an intermediate layer may be inserted between a first layer and a second layer. A germanium concentration in the intermediate layer may be between the concentration in the first layer and the second layer, and a germanium concentration according to a level in the eSiGe may linearly decrease due to the intermediate layer. Accordingly, various methods for forming semiconductor devices which have excellent performance while overcoming limitations caused by high integration have been studied.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a semiconductor device that may be easily manufactured.

One or more example embodiments also provide a semiconductor device with improved electrical characteristics.

Additional aspects will be set forth in part in the description which follows and, in part, will be apparent from the description, or may be learned by practice of the presented embodiments.

According to an aspect of an example embodiment, a semiconductor device may include a substrate including an active pattern, a channel pattern on the active pattern, and a source/drain pattern on a side surface of the channel pattern, the source/drain pattern including a first section between a first level and a second level that is higher than the first level, a first variation section between the second level and a third level that is higher than the second level, and a second section between the third level and a fourth level that is higher than the third level, where a rate of change in germanium concentration in the first variation section in a first direction may be greater than a rate of change in germanium concentration in each of the first section and the second section in the first direction, and a germanium concentration at each of the first level and the second level may be greater than 0 at % and equal to or less than 10 at %.

According to an aspect of an example embodiment, a semiconductor device may include a substrate including an active pattern, a channel pattern on the active pattern, and a source/drain pattern on a side surface of the channel pattern, the source/drain pattern including a first variation section, where a rate of change in germanium concentration in the first variation section in a first direction may be equal to or greater than 6 at %/nm and equal to or less than 10 at %/nm.

According to an aspect of an example embodiment, a semiconductor device may include a substrate including an active pattern, a device isolation pattern surrounding the active pattern, a channel pattern including a first semiconductor pattern, a second semiconductor pattern, and a third semiconductor pattern, each of the first semiconductor pattern, the second semiconductor pattern and the third semiconductor pattern being spaced apart from each other and being sequentially stacked on the active pattern, a gate electrode on the first semiconductor pattern, the second semiconductor pattern and the third semiconductor pattern, a gate insulating pattern between the gate electrode and the first semiconductor pattern, the second semiconductor pattern and the third semiconductor pattern, a gate spacer on a side surface of the gate electrode, a gate capping pattern on a top surface of the gate electrode, and a source/drain pattern connected to the first semiconductor pattern, the second semiconductor pattern and the third semiconductor pattern, the source/drain pattern including a first section between a first level and a second level higher that is than the first level, a first variation section between the second level and a third level that is higher than the second level, and a second section between the third level and a fourth level that is higher than the third level, where a rate of change in germanium concentration in the first variation section in a first direction may be greater than a rate of change in germanium concentration in each of the first section and the second section in the first direction, and a thickness of the first variation section may be less than a thickness of the second section.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
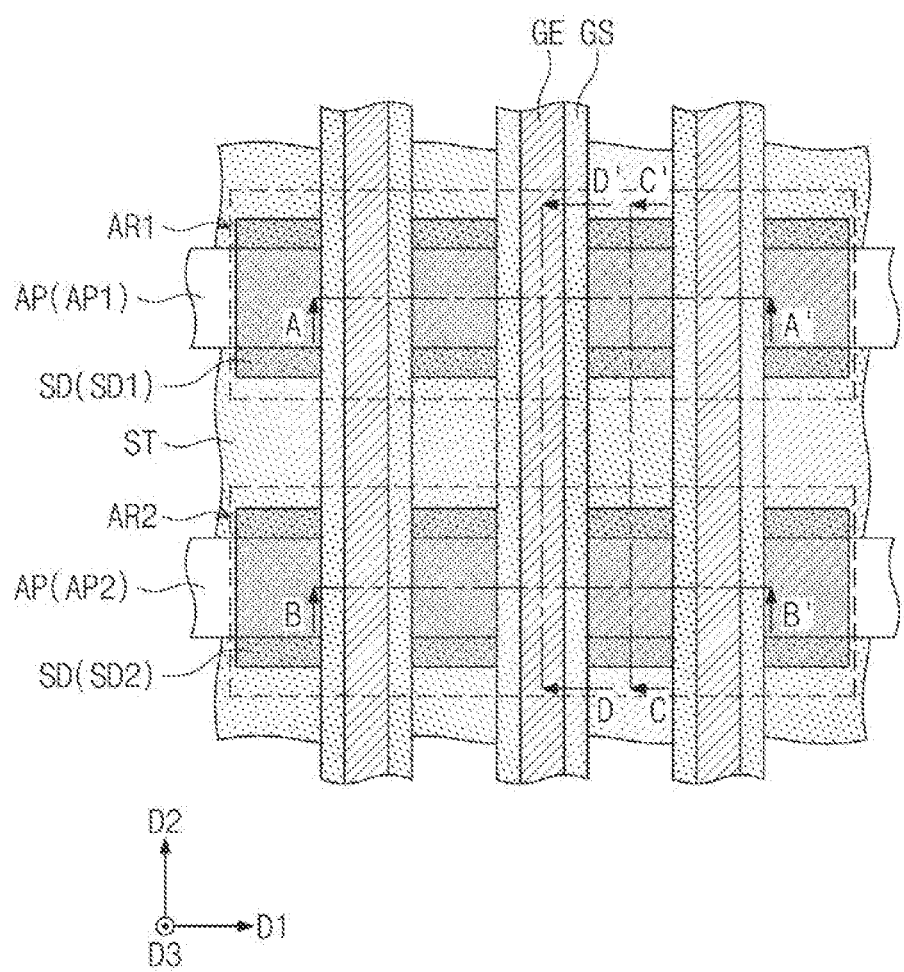
FIG. 1 is a diagram illustrating a semiconductor device according to example embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2A:
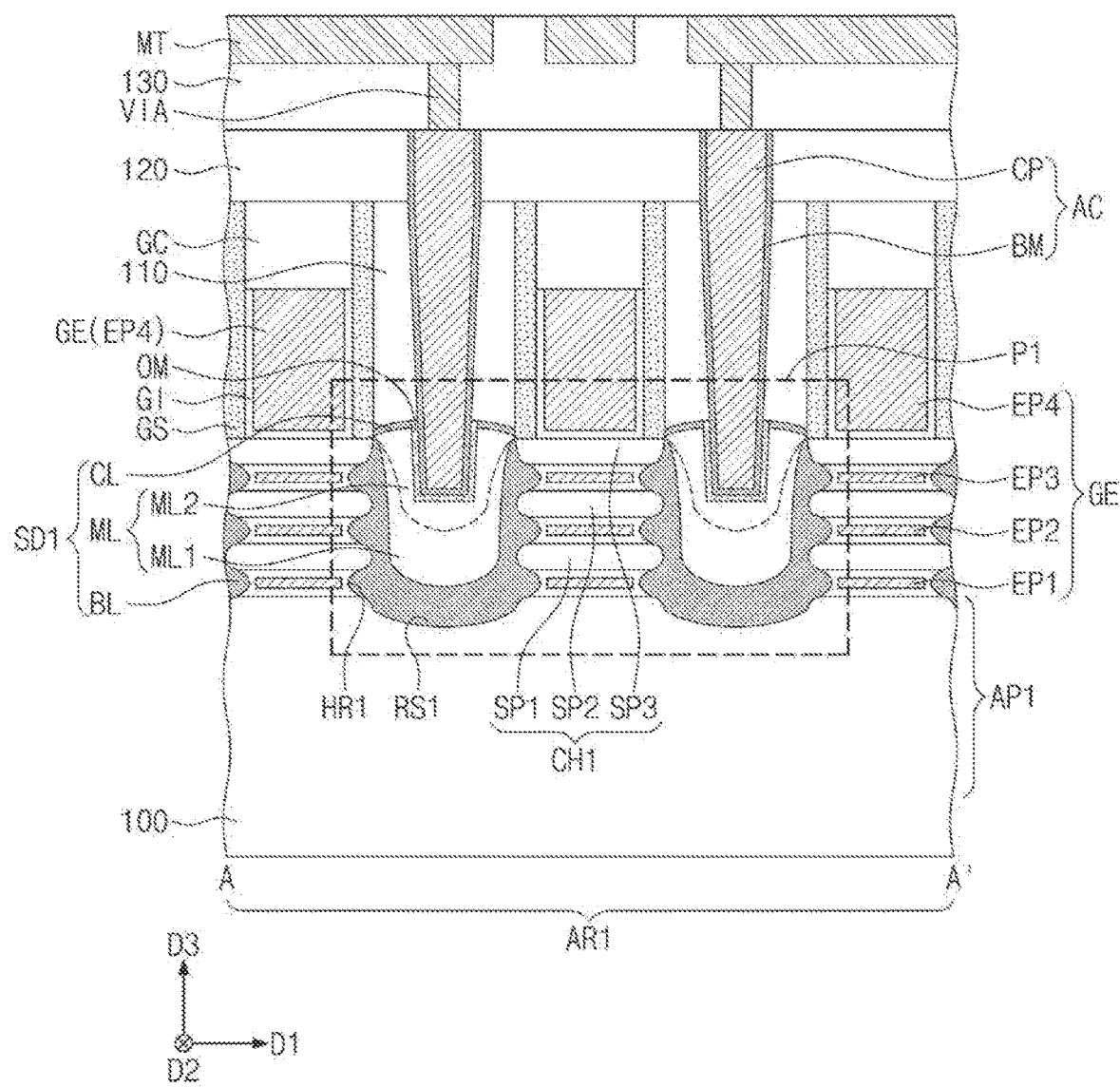
FIGS. 2A, 2B, 2C and 2D are cross-sectional views taken along lines A-A', B-B', C-C' and D-D' of FIG. 1, respectively according to example embodiments.
Figure 2B:
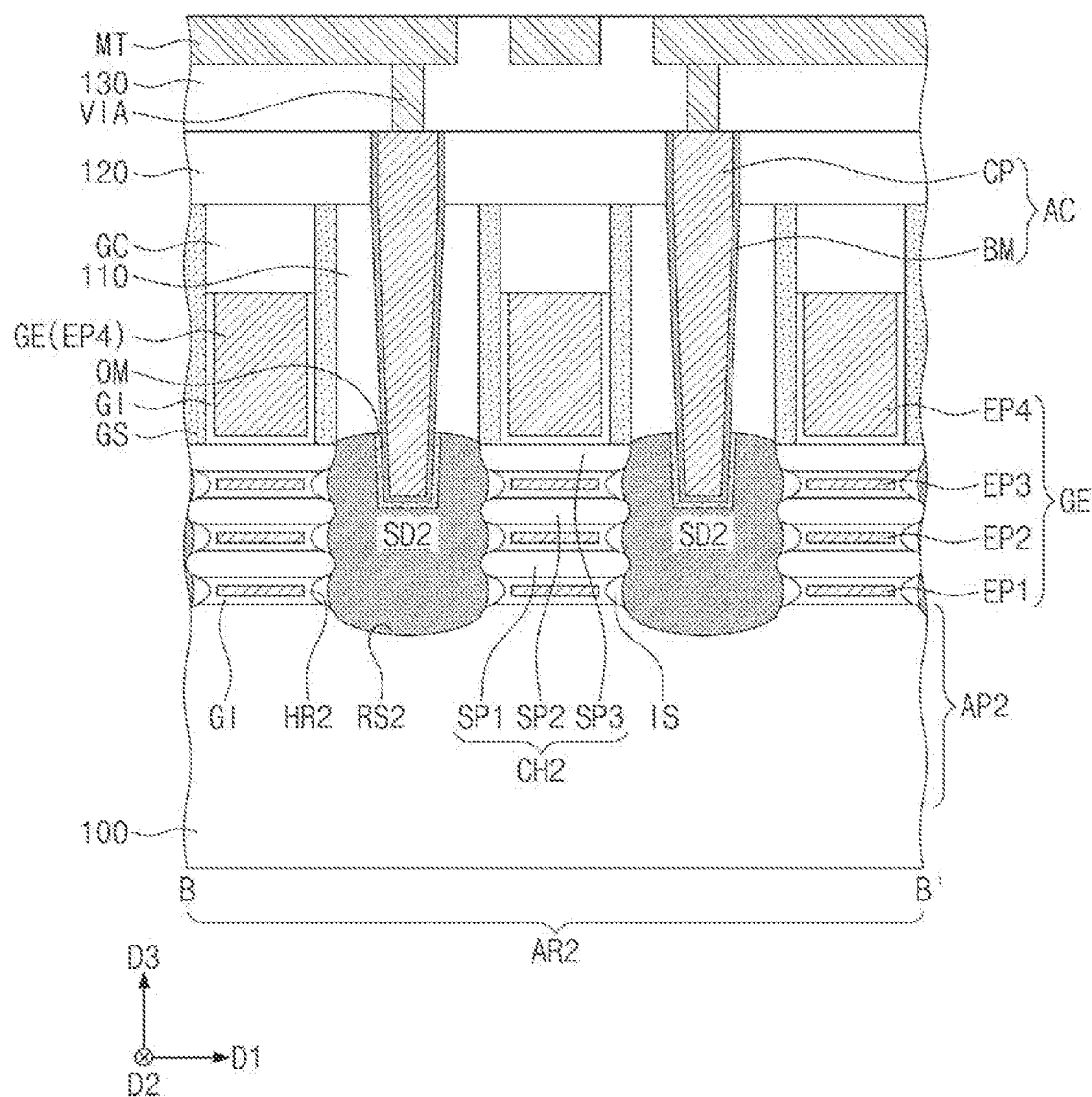
Figure 2C:
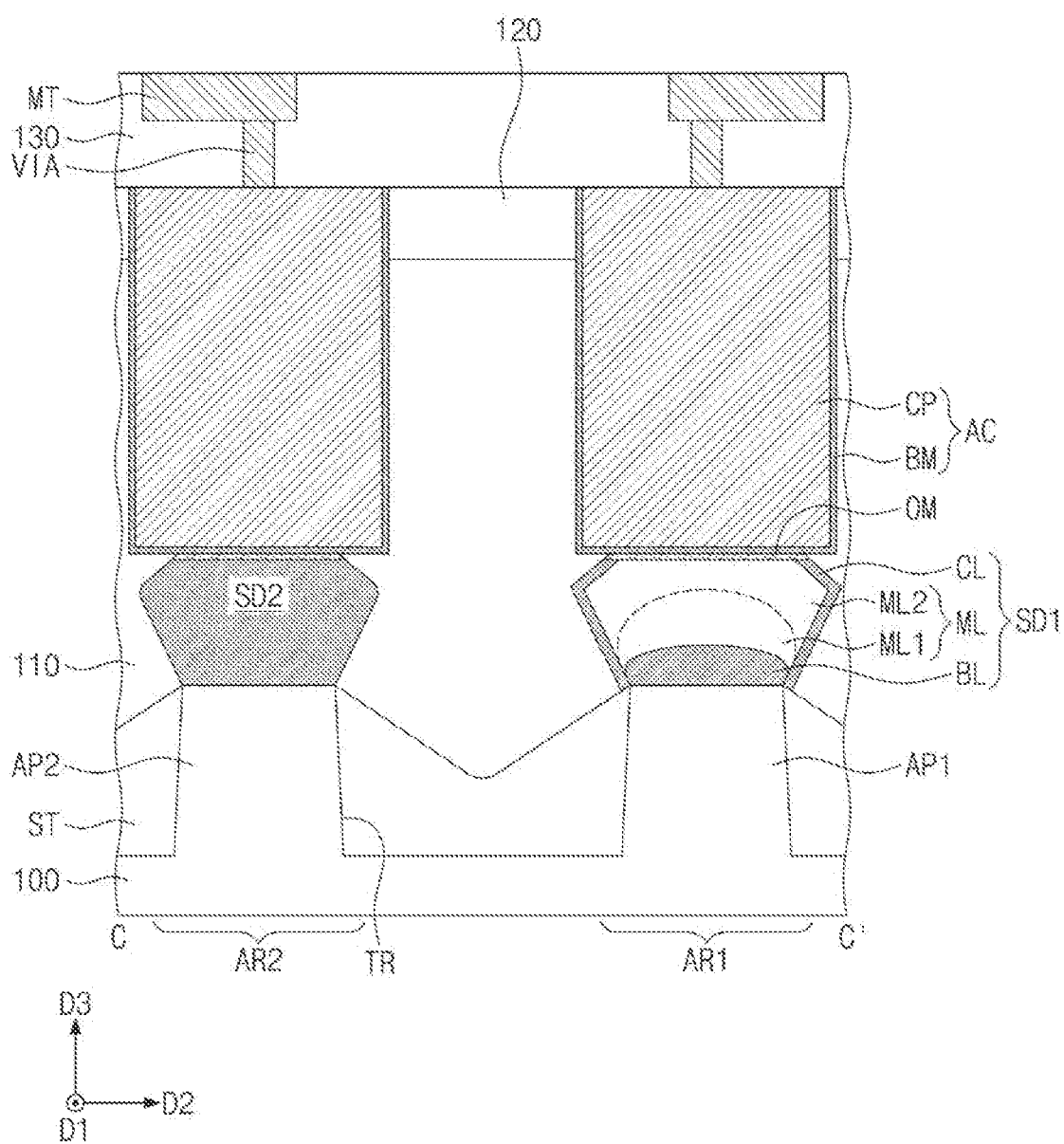
Figure 3:
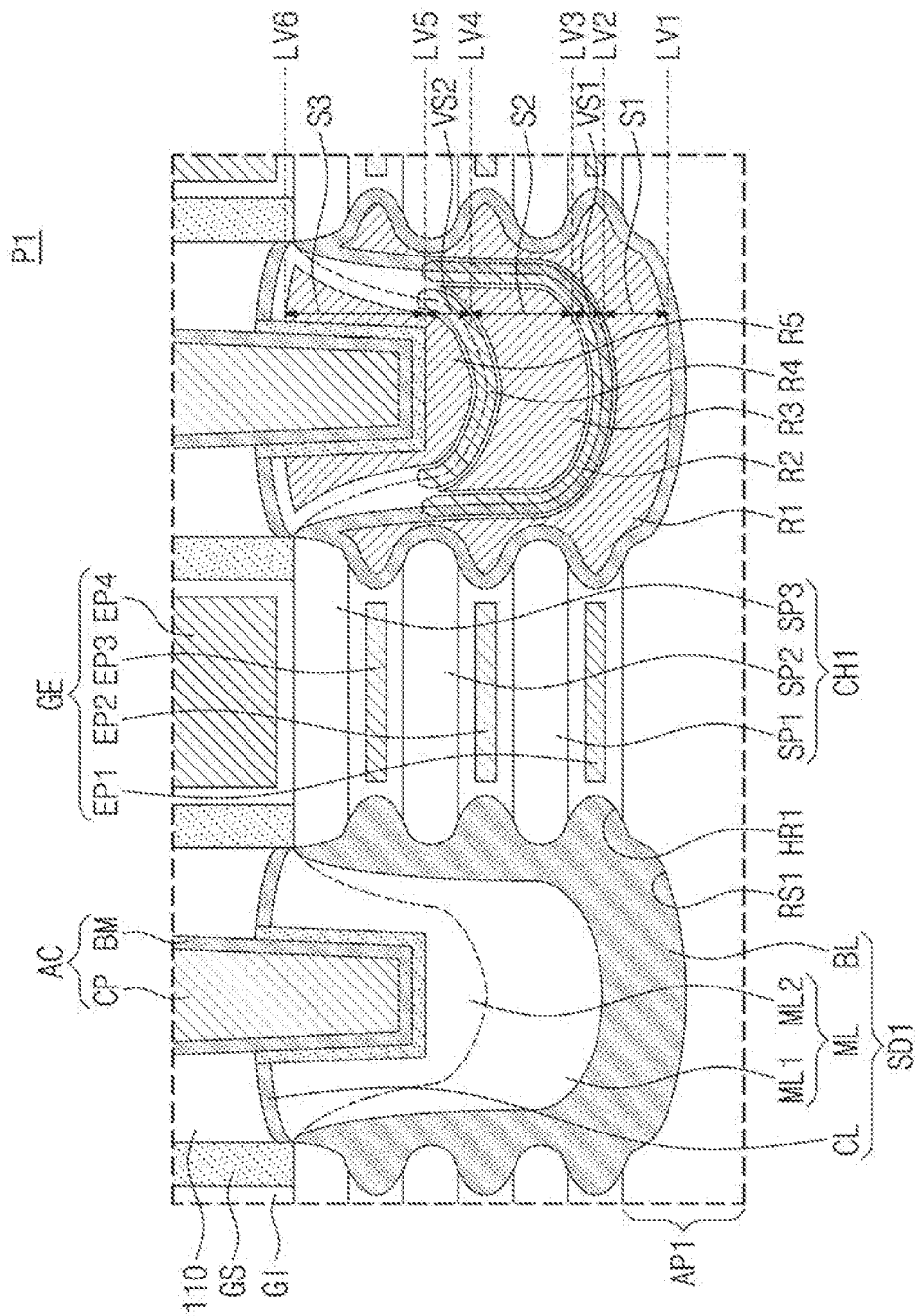
FIG. 3 is diagram of a portion 'P1' of FIG. 2A according to example embodiments.
Figure 4:
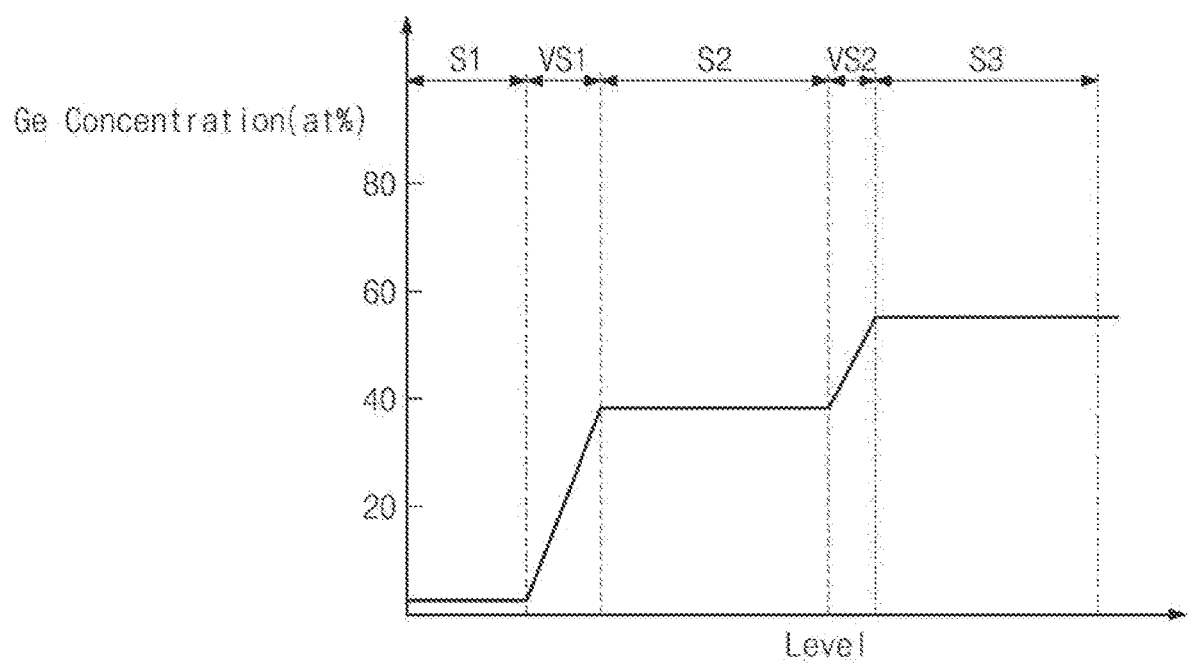
FIG. 4 is a graph showing a germanium concentration according to a level in a source/drain pattern of a semiconductor device according to example embodiments.

FIG. 1 is a diagram illustrating a semiconductor device according to example embodiments. FIGS. 2A, 2B, 2C and 2D are cross-sectional views taken along lines A-A', B-B', C-C' and D-D' of FIG. 1, respectively according to example embodiments. FIG. 3 is diagram of a portion 'P1' of FIG. 2A according to example embodiments. FIG. 4 is a graph showing a germanium concentration according to a level in a source/drain pattern of a semiconductor device according to example embodiments.

Figure 2D:
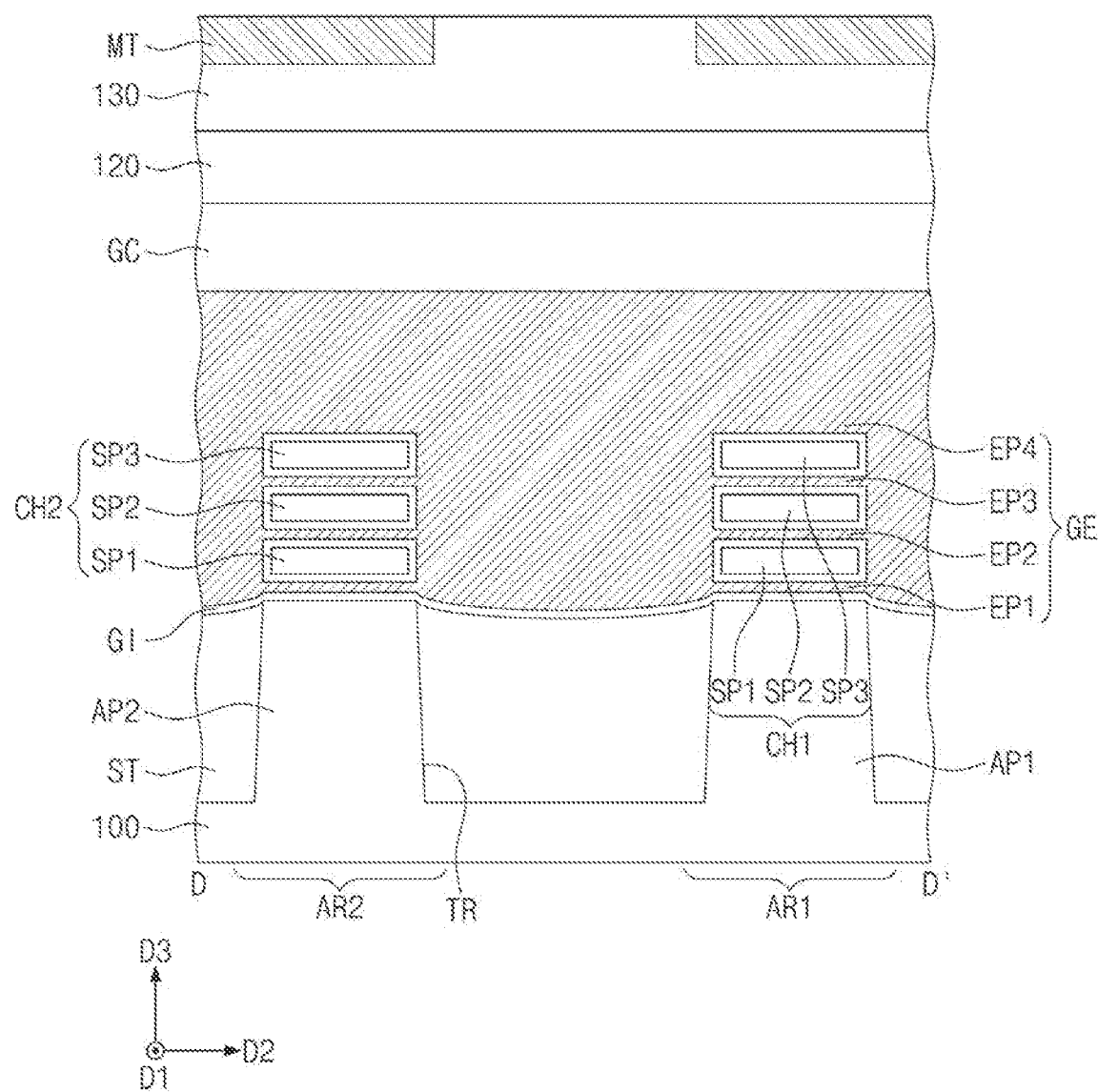

Referring to FIGS. 1 through 2D, a substrate 100 including a first active region AR1 and a second active region AR2 may be provided. The first and second active regions AR1 and AR2 may extend in a first direction D1 and may be spaced apart from each other in a second direction D2. The first and second directions D1 and D2 may be parallel to a bottom surface of the substrate 100 and may intersect (e.g., be perpendicular to) each other. The substrate 100 may be a semiconductor substrate including silicon, germanium or silicon-germanium, or a compound semiconductor substrate. For example, the substrate 100 may be a silicon substrate. For example, the first active region AR1 may be a p-type metal-oxide-semiconductor field effect transistors (MOSFETs) (PMOSFET) region, and the second active region AR2 may be an n-type MOSFET (NMOSFET) region.

An active pattern AP may be defined by a trench TR in an upper portion of the substrate 100. The active pattern AP may include a first active pattern AP1 and a second active pattern AP2. The first active pattern AP1 may be provided on the first active region AR1, and the second active pattern AP2 may be provided on the second active region AR2. The first and second active patterns AP1 and AP2 may extend in the first direction D1. The first and second active patterns AP1 and AP2 may be portions of the substrate 100, for example, portions of the substrate 100 which protrude in a third direction D3. The third direction D3 may be a direction perpendicular to the bottom surface of the substrate 100.

A device isolation pattern ST may fill the trench TR. The device isolation pattern ST may surround the first and second active patterns AP1 and AP2. For example, the device isolation pattern ST may include silicon oxide. The device isolation pattern ST may not cover first and second channel patterns CH1 and CH2 to be described later.

A first channel pattern CH1 may be provided on the first active pattern AP1, and a second channel pattern CH2 may be provided on the second active pattern AP2. A plurality of first channel patterns CH1 may be provided, and the plurality of first channel patterns CH1 may be spaced apart from each other in the first direction D1. A plurality of second channel patterns CH2 may be provided, and the plurality of second channel patterns CH2 may be spaced apart from each other in the first direction D1. Each of the first and second channel patterns CH1 and CH2 may include a first semiconductor pattern SP1, a second semiconductor pattern SP2 and a third semiconductor pattern SP3, which are sequentially stacked. The first to third semiconductor patterns SP1, SP2 and SP3 may be spaced apart from each other in the third direction D3. Each of the first to third semiconductor patterns SP1, SP2 and SP3 may include crystalline silicon.

A first source/drain pattern SD1 may be provided on the first active pattern AP1. A plurality of first source/drain patterns SD1 may be provided, and each of the plurality of first source/drain patterns SD1 may be provided between the first channel patterns CH1 adjacent to each other in the first direction D1. The first source/drain patterns SD1 may fill first recesses RS1 provided between the first channel patterns CH1, respectively. A pair of the first source/drain patterns SD1 may be disposed at both sides of each of the first channel patterns CH1, respectively, and the first to third semiconductor patterns SP1, SP2 and SP3 of the first channel pattern CH1 may connect the pair of first source/drain patterns SD1 to each other. The first source/drain patterns SD1 may be dopant regions having a first conductivity type (e.g., a p-type).

A second source/drain pattern SD2 may be provided on the second active pattern AP2. A plurality of second source/drain patterns SD2 may be provided, and each of the plurality of second source/drain patterns SD2 may be provided between the second channel patterns CH2 adjacent to each other in the first direction D1. The second source/drain patterns SD2 may fill second recesses RS2 provided between the second channel patterns CH2, respectively. A pair of the second source/drain patterns SD2 may be disposed at both sides of each of the second channel patterns CH2, respectively, and the first to third semiconductor patterns SP1, SP2 and SP3 of the second channel pattern CH2 may connect the pair of second source/drain patterns SD2 to each other. The second source/drain patterns SD2 may be dopant regions having a second conductivity type (e.g., an n-type).

The first and second source/drain patterns SD1 and SD2 may include epitaxial patterns formed by a selective epitaxial growth (SEG) process. For example, a top surface of each of the first and second source/drain patterns SD1 and SD2 may be located at a higher level than a top surface of the third semiconductor pattern SP3. Alternatively, the top surface of at least one of the first and second source/drain patterns SD1 and SD2 may be located at substantially the same level as the top surface of the third semiconductor pattern SP3.

In example embodiments, the first source/drain patterns SD1 may include a semiconductor element (e.g., SiGe) of which a lattice constant is greater than a lattice constant of a semiconductor element of the substrate 100. Thus, the pair of first source/drain patterns SD1 may provide compressive stress to the first channel pattern CH1 therebetween. The second source/drain patterns SD2 may include the same semiconductor element (e.g., Si) as the substrate 100.

A side surface of each of the first and second source/drain patterns SD1 and SD2 may have an uneven embossing shape. In other words, the side surface of each of the first and second source/drain patterns SD1 and SD2 may have a wave-shaped profile. The first source/drain pattern SD1 may fill first horizontal recesses HR1 recessed in the first direction D1 toward first to third electrode patterns EP1, EP2 and EP3 to be described later. The second source/drain pattern SD2 may fill second horizontal recesses HR2 recessed in the first direction D1 toward first to third electrode patterns EP1, EP2 and EP3 to be described later. For example, as illustrated in FIGS. 2A and 2B, portions of the side surface of each of the first and second source/drain patterns SD1 and SD2 which are provided beside the first to third electrode patterns EP1, EP2 and EP3 to be described later may protrude in the first direction D1 from other portions of the side surface of each of the first and second source/drain patterns SD1 and SD2 which are provided beside the first to third semiconductor patterns SP1, SP2 and SP3. Alternatively, portions of the side surface of each of the first and second source/drain patterns SD1 and SD2 which are provided beside the first to third semiconductor patterns SP1, SP2 and SP3 may protrude in the first direction D1 from other portions of the side surface of each of the first and second source/drain patterns SD1 and SD2 which are provided beside the first to third electrode patterns EP1, EP2 and EP3 to be described later. However, example embodiments of the disclosure are not limited thereto.

Hereinafter, features of the first source/drain pattern SD1 will be described in more detail with reference to FIGS. 3 and 4.

Referring to FIGS. 3 and 4, the first source/drain pattern SD1 may include a buffer layer BL, a main layer ML, and a capping layer CL. The buffer layer BL may cover an inner surface of the first recess RS1 and may fill the first horizontal recess HR1. The main layer ML may cover the buffer layer BL and may fill a portion of the first recess RS1. The capping layer CL may cover a top surface of the main layer ML. For example, the capping layer CL may conformally cover the main layer ML protruding above the first recess RS1 as illustrated in FIG. 3, but example embodiments of the disclosure are not limited thereto. The main layer ML may include a first main layer ML1 adjacent to the buffer layer BL, and a second main layer ML2 between the first main layer ML1 and the capping layer CL.

The buffer layer BL and the main layer ML may include a semiconductor element of which a lattice constant is greater than the lattice constant of the semiconductor element of the substrate 100. For example, the substrate 100 may include silicon (Si), and the buffer layer BL and the main layer ML may include silicon-germanium (SiGe). A lattice constant of germanium may be greater than a lattice constant of silicon. The capping layer CL may include the same semiconductor element (e.g., Si) as the substrate 100. In example embodiments, due to a diffusion phenomenon of an element in the main layer ML, the capping layer CL may further include the same element as the main layer ML.

The first source/drain pattern SD1 may include a first region R1, a second region R2, a third region R3, a fourth region R4, and a fifth region R5. The first region R1 may be a region adjacent to the inner surface of the first recess RS1 and may be a region in which a portion of the buffer layer BL is provided. The second region R2 may be a region in which another portion of the buffer layer BL and a portion of the first main layer ML1 are provided and may be provided at a boundary of the buffer layer BL and the first main layer ML1. The third region R3 may be a region in which another portion of the first main layer ML1 is provided on the second region R2. The fourth region R4 may be a region in which still another portion of the first main layer ML1 and a portion of the second main layer ML2 are provided and may be provided at a boundary of the first main layer ML1 and the second main layer ML2. The fifth region R5 may be a region in which another portion of the second main layer ML2 is provided on the fourth region R4.

Germanium concentrations in the first to fifth regions R1, R2, R3, R4 and R5 of the first source/drain pattern SD1 may be different from each other. For example, a germanium concentration in the first source/drain pattern SD1 may increase from the first region R1 to the fifth region R5.

A difference between a maximum value and a minimum value of the germanium concentration in the first region R1 of the first source/drain pattern SD1 may be 10 at % or less. The germanium concentration in the first region R1 of the first source/drain pattern SD1 may be greater than 0 at % and may be equal to or less than 10 at %. For example, the whole of the first region R1 of the first source/drain pattern SD1 may have substantially the same germanium concentration (or a substantially uniform germanium concentration).

A difference between a maximum value and a minimum value of the germanium concentration in the third region R3 of the first source/drain pattern SD1 may be 10 at % or less. The germanium concentration in the third region R3 of the first source/drain pattern SD1 may be equal to or greater than 30 at % and may be equal to or less than 50 at %. For example, the whole of the third region R3 of the first source/drain pattern SD1 may have substantially the same germanium concentration (or a substantially uniform germanium concentration).

A difference between a maximum value and a minimum value of the germanium concentration in the fifth region R5 of the first source/drain pattern SD1 may be 10 at % or less. The germanium concentration in the fifth region R5 of the first source/drain pattern SD1 may be equal to or greater than 50 at % and may be equal to or less than 60 at %. For example, the whole of the fifth region R5 of the first source/drain pattern SD1 may have substantially the same germanium concentration (or a substantially uniform germanium concentration). The germanium concentration in the fifth region R5 of the first source/drain pattern SD1 may be greater than the germanium concentration in the third region R3.

The germanium concentration in the second region R2 of the first source/drain pattern SD1 may become progressively less toward the first region R1 and may become progressively greater toward the third region R3. The germanium concentration in the fourth region R4 of the first source/drain pattern SD1 may become progressively less toward the third region R3 and may become progressively greater toward the fifth region R5. A change in germanium concentration according to a position in each of the second and fourth regions R2 and R4 of the first source/drain pattern SD1 may be greater than that in each of the first, third and fifth regions R1, R3 and R5.

Due to the change in germanium concentration in the first to fifth regions R1, R2, R3, R4 and R5 of the first source/drain pattern SD1, a change in germanium concentration over levels (i.e., a level (or height) in the third direction D3) in the first source/drain pattern SD1 may be shown as, for example, FIG. 4.

More particularly, the change in concentration over levels may have a step-shaped profile. For example, when a level rises along first to sixth levels LV1, LV2, LV3, LV4, LV5 and LV6 sequentially increased from the first level LV1, a rate of the change in germanium concentration over levels in the first source/drain pattern SD1 may be greater in each of a first variation section VS1 and a second variation section VS2 than in each of a first section S1, a second section S2 and a third section S3. The first section S1 may be a section between the first and second levels LV1 and LV2. The first variation section VS1 may be a section between the second and third levels LV2 and LV3. The second section S2 may be a section between the third and fourth levels LV3 and LV4. The second variation section VS2 may be a section between the fourth and fifth levels LV4 and LV5. The third section S3 may be a section between the fifth and sixth levels LV5 and LV6.

A germanium concentration in the first section S1 of the first source/drain pattern SD1 may be greater than 0 at % and may be equal to or less than 10 at %. For example, the germanium concentration in the first source/drain pattern SD1 at each of the first level LV1 and the second level LV2 may be greater than 0 at % and may be equal to or less than 10 at %. A difference between the germanium concentrations of the first source/drain pattern SD1 at the first level LV1 and the second level LV2 may be 10 at % or less.

A germanium concentration in the second section S2 of the first source/drain pattern SD1 may be equal to or greater than 30 at % and may be equal to or less than 50 at %. For example, the germanium concentration in the first source/drain pattern SD1 at each of the third level LV3 and the fourth level LV4 may be equal to or greater than 30 at % and may be equal to or less than 50 at %. A difference between the germanium concentrations of the first source/drain pattern SD1 at the third level LV3 and the fourth level LV4 may be 10 at % or less.

A germanium concentration in the third section S3 of the first source/drain pattern SD1 may be equal to or greater than 50 at % and may be equal to or less than 60 at %. For example, the germanium concentration in the first source/drain pattern SD1 at each of the fifth level LV5 and the sixth level LV6 may be equal to or greater than 50 at % and may be equal to or less than 60 at %. A difference between the germanium concentrations of the first source/drain pattern SD1 at the fifth level LV5 and the sixth level LV6 may be 10 at % or less. The germanium concentration in the third section S3 of the first source/drain pattern SD1 may be greater than that in the second section S2. For example, the germanium concentration of the first source/drain pattern SD1 at the fifth level LV5 (i.e., a bottom end of the third section S3) may be greater than that at the fourth level LV4 (i.e., a top end of the second section S2).

The rate of the change in germanium concentration from the second level LV2 to the third level LV3 (e.g., in direction D3) may be equal to or greater than 6 at %/nm and may be equal to or less than 10 at %/nm. For example, the rate of the change in germanium concentration in the first source/drain pattern SD1 in the first variation section VS1 (e.g., in direction D3) may be equal to or greater than 6 at %/nm and may be equal to or less than 10 at %/nm. The rate of the change in germanium concentration from the fourth level LV4 to the fifth level LV5 (e.g., in direction D3) may be equal to or greater than 6 at %/nm and may be equal to or less than 10 at %/nm. For example, the rate of the change in germanium concentration in the first source/drain pattern SD1 in the second variation section VS2 (e.g., in direction D3) may be equal to or greater than 6 at %/nm and may be equal to or less than 10 at %/nm. The rate of the change in germanium concentration in the first source/drain pattern SD1 in each of the first and second variation sections VS1 and VS2 (e.g., in direction D3) may be greater than that in each of the first to third sections S1, S2 and S3.

The germanium concentration in the first source/drain pattern SD1 may be greater at the third level LV3 than at the second level LV2. The germanium concentration in the first variation section VS1 of the first source/drain pattern SD1 may become progressively greater from the second level LV2 toward the third level LV3. The germanium concentration in the first source/drain pattern SD1 may be greater at the fifth level LV5 than at the fourth level LV4. The germanium concentration in the second variation section VS2 of the first source/drain pattern SD1 may become progressively greater from the fourth level LV4 toward the fifth level LV5.

Thicknesses (e.g., thicknesses in the third direction D3) of the first to third sections S1, S2 and S3 and the first and second variation sections VS1 and VS2 may be variously changed depending on positions at which the sections are defined. For example, as illustrated in FIG. 3, in a region adjacent to an active contact AC to be described later, the thicknesses of the first to third sections S1, S2 and S3 may be greater than the thicknesses of the first and second variation sections VS1 and VS2. However, example embodiments of the disclosure are not limited thereto. In a region vertically overlapping with the active contact AC, an upper section (e.g., the third section S3) may not be provided.

An intermediate layer may not be provided between the buffer layer BL and the main layer ML. The intermediate layer may be a layer in which a germanium concentration is higher than that of the buffer layer BL and lower than that of the main layer ML. Since the intermediate layer is not provided, processes for manufacturing the semiconductor device may be simplified, and thus the semiconductor device may be easily manufactured. In addition, the buffer layer BL and the main layer ML which have different germanium concentrations may directly contact each other, and thus the compressive stress provided to the first to third semiconductor patterns SP1, SP2 and SP3 by the first source/drain pattern SD1 may be increased. As a result, mobility of holes may be increased, and thus electrical characteristics of the semiconductor device may be improved.

Referring again to FIGS. 1 through 2D, a gate electrode GE may intersect the first and second channel patterns CH1 and CH2. A plurality of gate electrode GE may be provided. The plurality of gate electrodes GE may extend in the second direction D2 and may be spaced apart from each other in the first direction D1. The gate electrode GE may vertically overlap with the first and second channel patterns CH1 and CH2.

In example embodiments, the gate electrode GE may include a first electrode pattern EP1, a second electrode pattern EP2, a third electrode pattern EP3, and a fourth electrode pattern EP4. The first electrode pattern EP1 may be disposed between the active pattern AP and the first semiconductor pattern SP1. The second electrode pattern EP2 may be disposed between the first semiconductor pattern SP1 and the second semiconductor pattern SP2. The third electrode pattern EP3 may be disposed between the second semiconductor pattern SP2 and the third semiconductor pattern SP3. The fourth electrode pattern EP4 may be provided on the third semiconductor pattern SP3.

The gate electrode GE may include a first metal pattern and a second metal pattern on the first metal pattern. The first metal pattern may be provided on a gate insulating pattern GI to be described later and may be adjacent to the first to third semiconductor patterns SP1, SP2 and SP3. The first metal pattern may include a work function metal for adjusting a threshold voltage of a transistor. A desired threshold voltage of the transistor may be obtained by adjusting a thickness and a composition of the first metal pattern. For example, the first to third electrode patterns EP1, EP2 and EP3 of the gate electrode GE may be formed of the first metal pattern including the work function metal.

The first metal pattern may include a metal nitride layer. For example, the first metal pattern may include nitrogen (N) and at least one metal such as titanium (Ti), tantalum (Ta), aluminum (Al), tungsten (W), and molybdenum (Mo). In addition, the first metal pattern may further include carbon (C). In example embodiments, the first metal pattern may include a plurality of stacked work function metal layers.

The second metal pattern may include a metal having a resistance lower than that of the first metal pattern. For example, the second metal pattern may include at least one metal such as tungsten (W), aluminum (Al), titanium (Ti), and tantalum (Ta). For example, the fourth electrode pattern EP4 of the gate electrode GE may include the first metal pattern and the second metal pattern on the first metal pattern.

Inner spacers IS may be disposed between the gate electrode GE and the second source/drain pattern SD2. More particularly, each of the inner spacers IS may be disposed between the second source/drain pattern SD2 and each of the first to third electrode patterns EP1, EP2 and EP3 of the gate electrode GE. The inner spacers IS may separate the gate electrode GE from the second source/drain pattern SD2. The inner spacers IS may reduce a leakage current caused from the gate electrode GE. For example, the inner spacers IS may include at least one of silicon oxide, silicon oxynitride, or silicon nitride.

A pair of gate spacers GS may be disposed on both side surfaces of the fourth electrode pattern EP4 of the gate electrode GE, respectively. The gate spacers GS may extend in the second direction D2 along the gate electrode GE. Top surfaces of the gate spacers GS may be higher than a top surface of the gate electrode GE and may be substantially coplanar with a top surface of a first interlayer insulating layer 110 to be described later. For example, the gate spacers GS may include at least one of SiCN, SiCON, or SiN. In example embodiments, each of the gate spacers GS may include a multi-layer including at least two of SiCN, SiCON, or SiN.

A gate capping pattern GC may be provided on the gate electrode GE. The gate capping pattern GC may extend in the second direction D2 along the gate electrode GE. The gate capping pattern GC may include a material having an etch selectivity with respect to first and second interlayer insulating layers 110 and 120 to be described later. For example, the gate capping pattern GC may include at least one of SiON, SiCN, SiCON, or SiN.

A gate insulating pattern GI may be disposed between the gate electrode GE and the first to third semiconductor patterns SP1, SP2 and SP3 (i.e., between the gate electrode GE and the first channel pattern CH1 and between the gate electrode GE and the second channel pattern CH2). The gate insulating pattern GI may cover a top surface, a bottom surface and both side surfaces of each of the first to third semiconductor patterns SP1, SP2 and SP3. The gate insulating pattern GI may cover a top surface of the device isolation pattern ST under the gate electrode GE.

In example embodiments of the disclosure, the gate insulating pattern GI may include silicon oxide, silicon oxynitride, and/or a high-k dielectric material. For example, the gate insulating pattern GI may have a structure in which the silicon oxide and the high-k dielectric material are stacked. The high-k dielectric material may have a dielectric constant higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A first interlayer insulating layer 110 may be provided on the substrate 100. The first interlayer insulating layer 110 may cover the gate spacers GS and the first and second source/drain patterns SD1 and SD2. The top surface of the first interlayer insulating layer 110 may be substantially coplanar with a top surface of the gate capping pattern GC and the top surface of the gate spacer GS.

A second interlayer insulating layer 120 may be disposed on the first interlayer insulating layer 110 to cover the gate capping pattern GC. A third interlayer insulating layer 130 may be provided on the second interlayer insulating layer 120. For example, the first to third interlayer insulating layers 110, 120 and 130 may include silicon oxide.

An active contact AC may penetrate the first and second interlayer insulating layers 110 and 120 along the third direction D3. The active contact AC may be provided in plurality, and each of the active contacts AC may be connected to a corresponding one of the first and second source/drain patterns SD1 and SD2. A lower portion of each of the active contacts AC may be buried in an upper portion of the corresponding source/drain pattern SD1 or SD2. A pair of the active contacts AC may be provided at both sides of the gate electrode GE, respectively.

The active contact AC may include a conductive pattern CP and a barrier pattern BM surrounding the conductive pattern CP. For example, the conductive pattern CP may include at least one metal of aluminum, copper, tungsten, molybdenum, or cobalt. The barrier pattern BM may cover side surfaces and a bottom surface of the conductive pattern CP. The barrier pattern BM may include at least one of a metal or a metal nitride. The metal may include at least one of titanium, tantalum, tungsten, nickel, cobalt, or platinum. The metal nitride may include at least one of titanium nitride (TiN), tantalum nitride (TaN), tungsten nitride (WN), nickel nitride (NiN), cobalt nitride (CoN), or platinum nitride (PtN).

An ohmic pattern OM may be disposed between the active contact AC and the corresponding source/drain pattern SD1 or SD2. The active contact AC may be electrically connected to the corresponding source/drain pattern SD1 or SD2 through the ohmic pattern OM. For example, the ohmic pattern OM may include at least one of titanium silicide, tantalum silicide, tungsten silicide, nickel silicide, or cobalt silicide.

Metal patterns MT may be provided in the third interlayer insulating layer 130. Vias VIA may connect the metal patterns MT to the active contacts AC. Gate contacts may be connected to the gate electrodes GE, and some of the metal patterns MT may be connected to the gate contacts through some of the vias VIA. Even though not shown in the drawings, the metal patterns MT may be provided in a plurality of layers, the vias VIA may be provided in a plurality of layers, and the metal patterns MT and the vias VIA may be alternately stacked. The metal patterns MT and the vias VIA may include at least one metal material of aluminum, copper, tungsten, molybdenum, ruthenium, or cobalt.

Figure 5A:
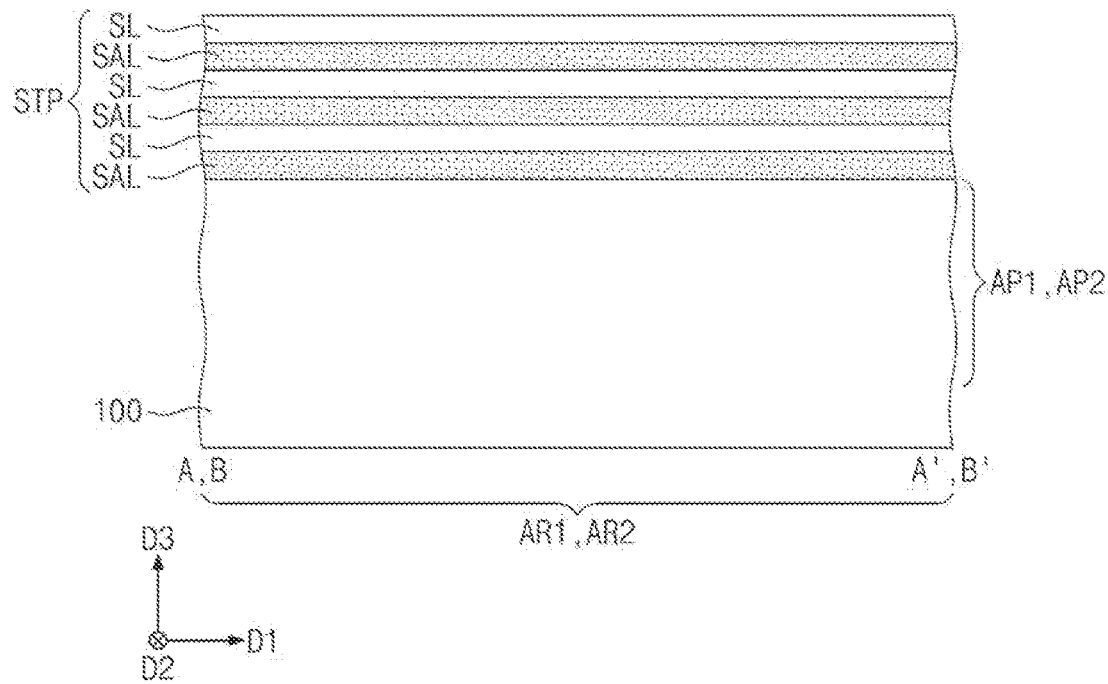
FIGS. 5A, 5B, 6A, 6B, 6C, 7A, 7B, 7C, 8A, 8B, 8C and 8D are cross-sectional views illustrating a method of manufacturing a semiconductor device according to example embodiments.
Figure 5B:
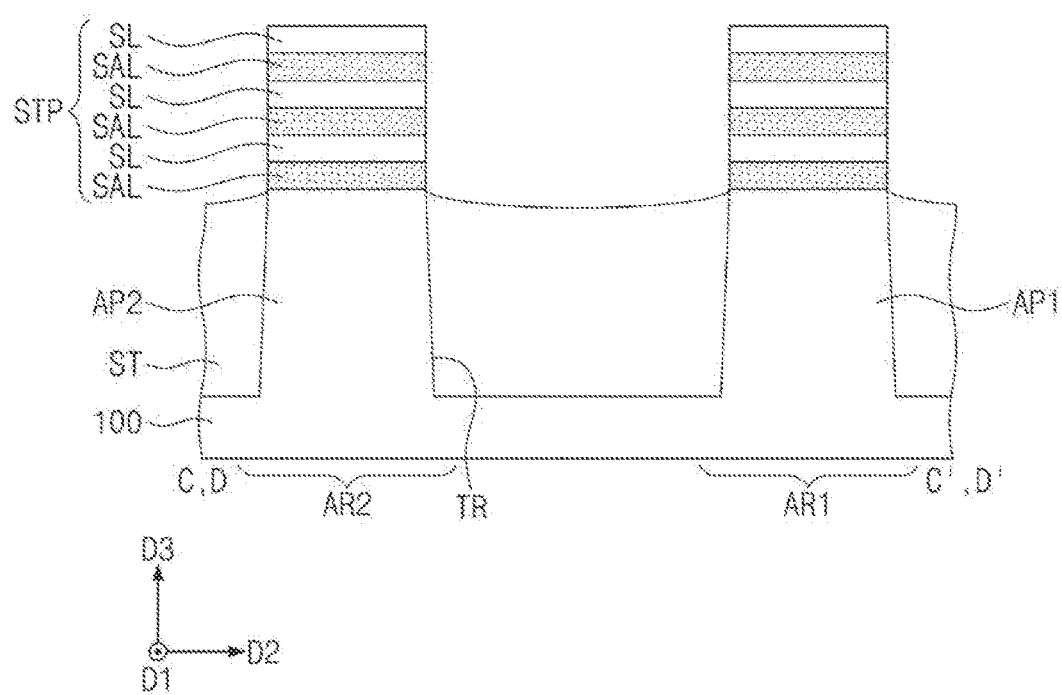
Figure 6A:
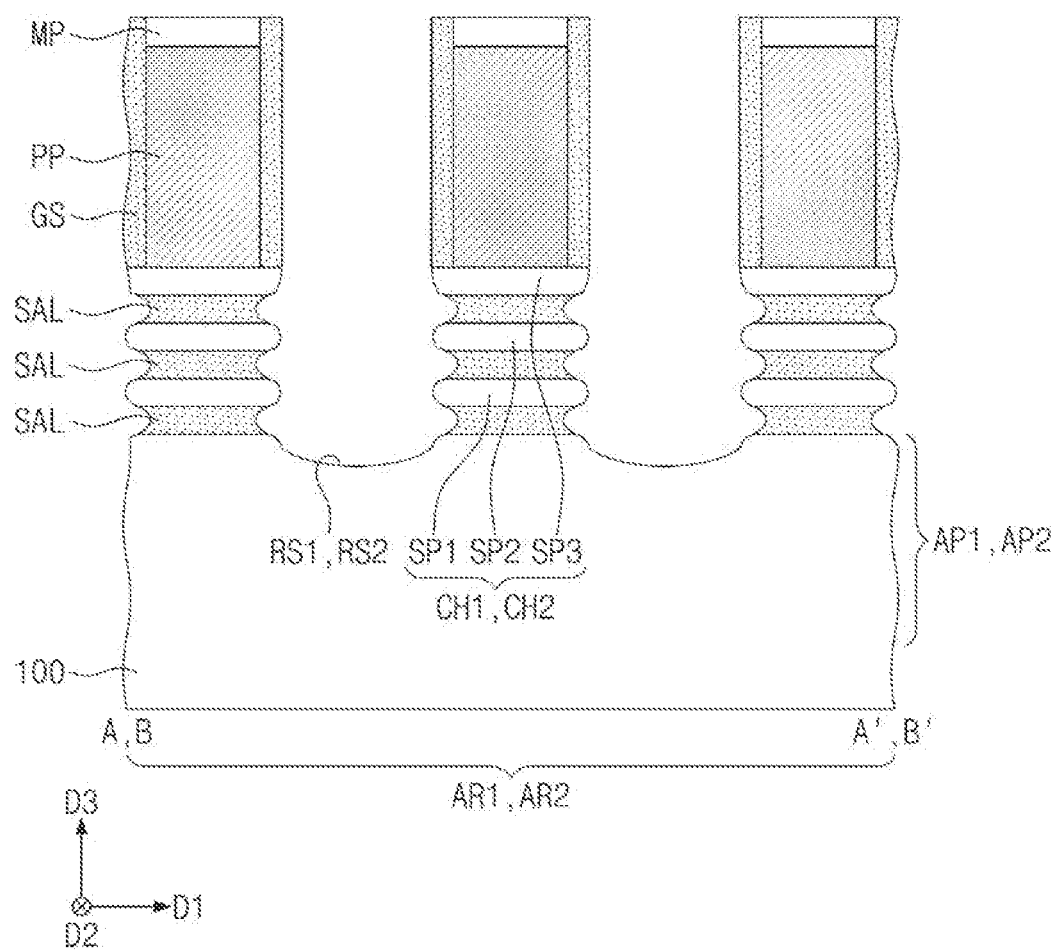
Figure 6B:
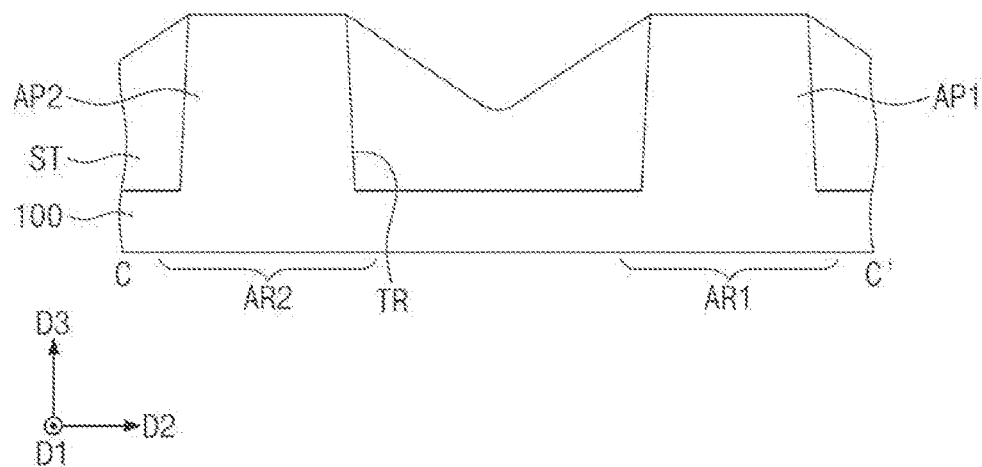
Figure 6C:
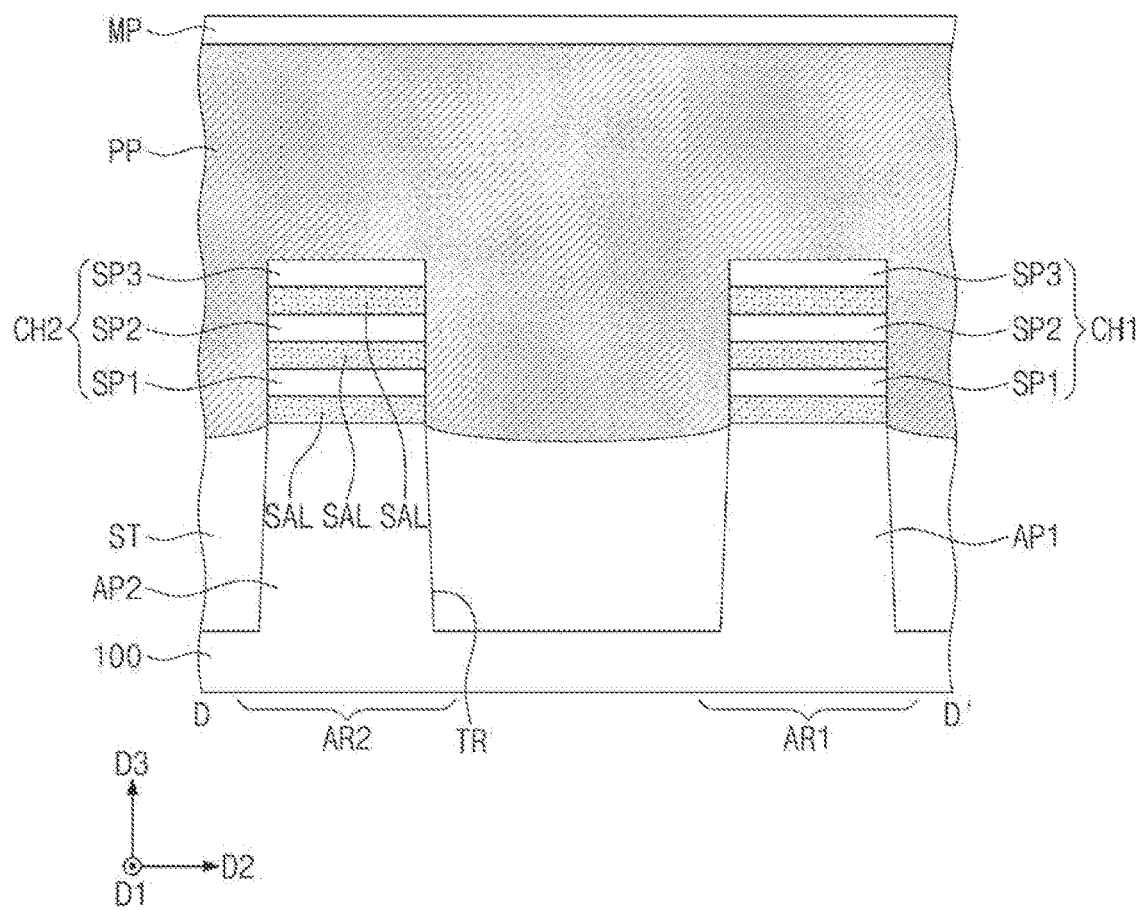
Figure 7A:
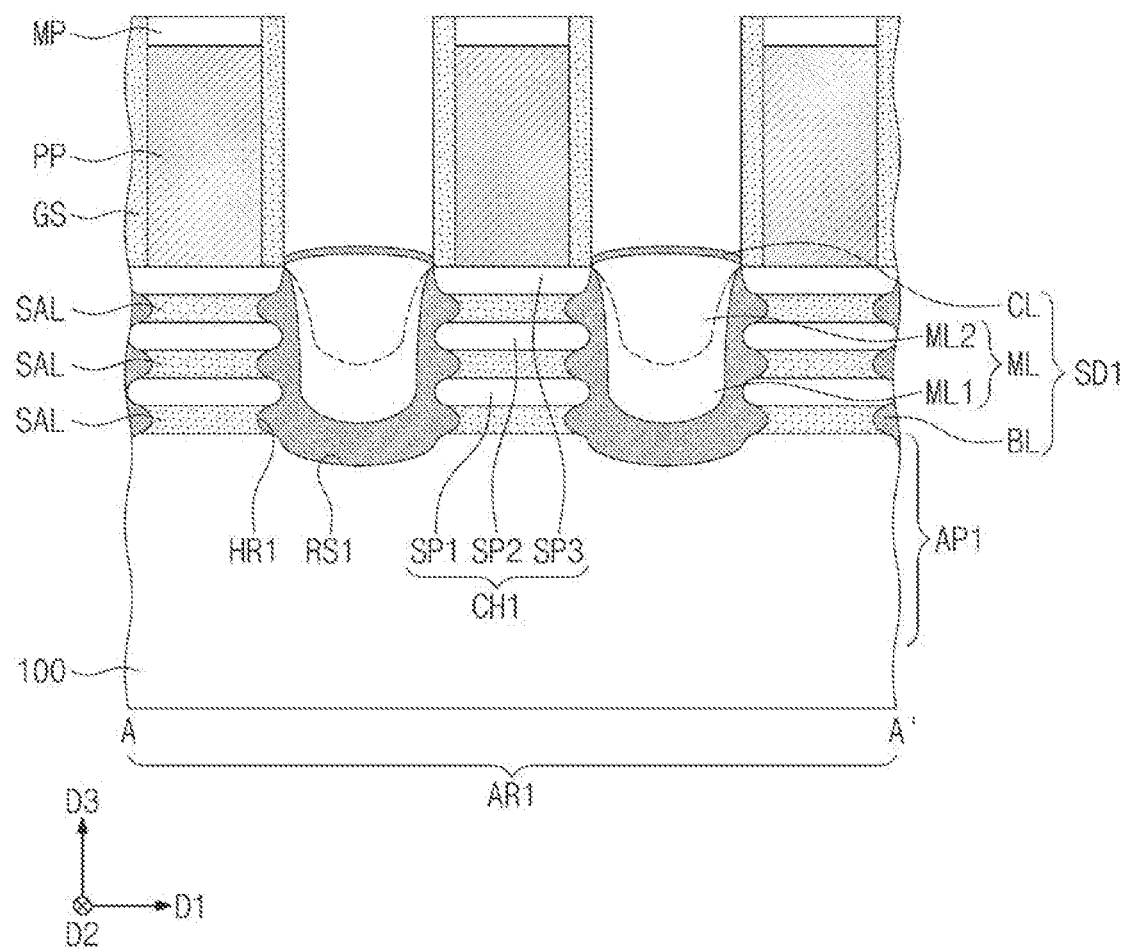
Figure 7B:
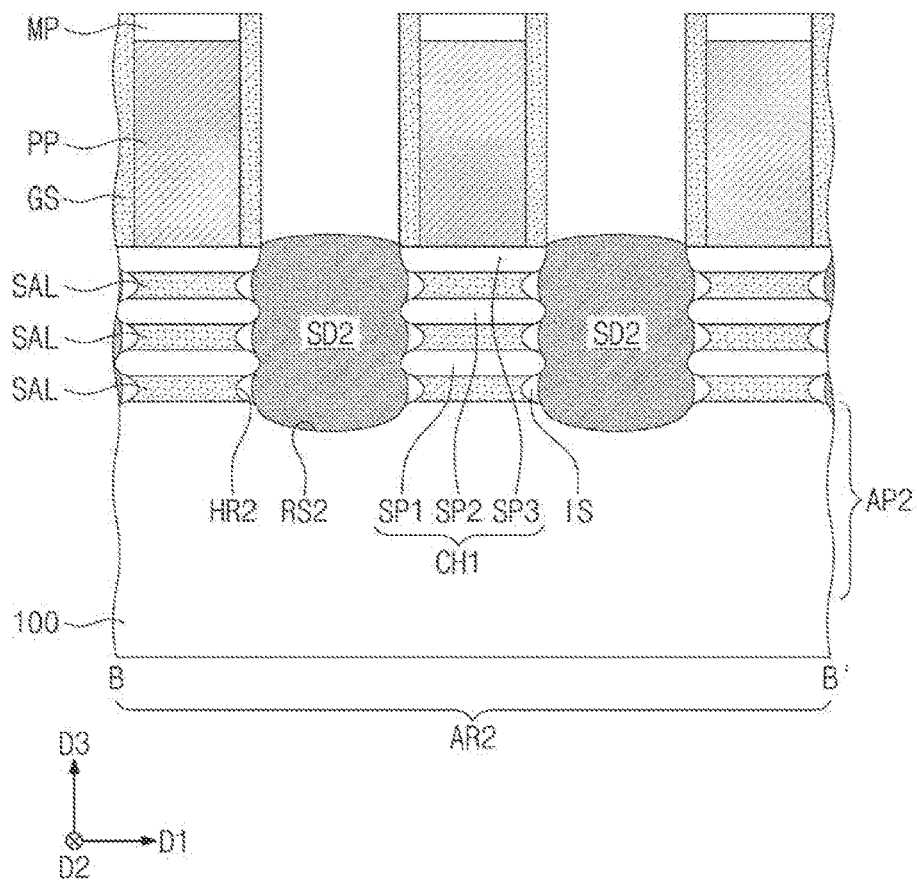
Figure 7C:
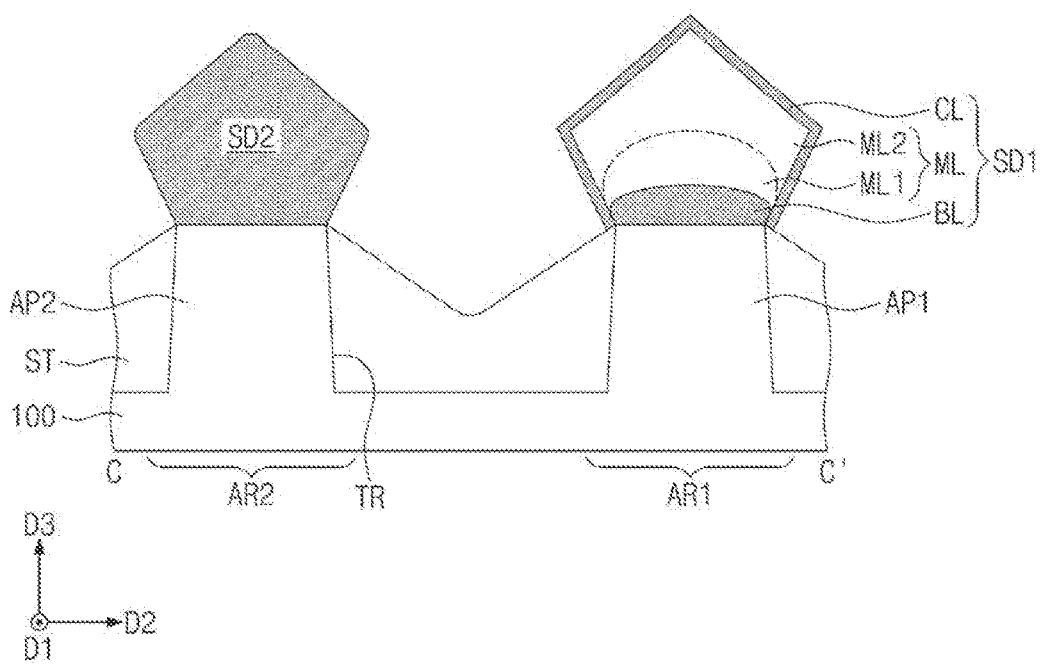
Figure 8A:
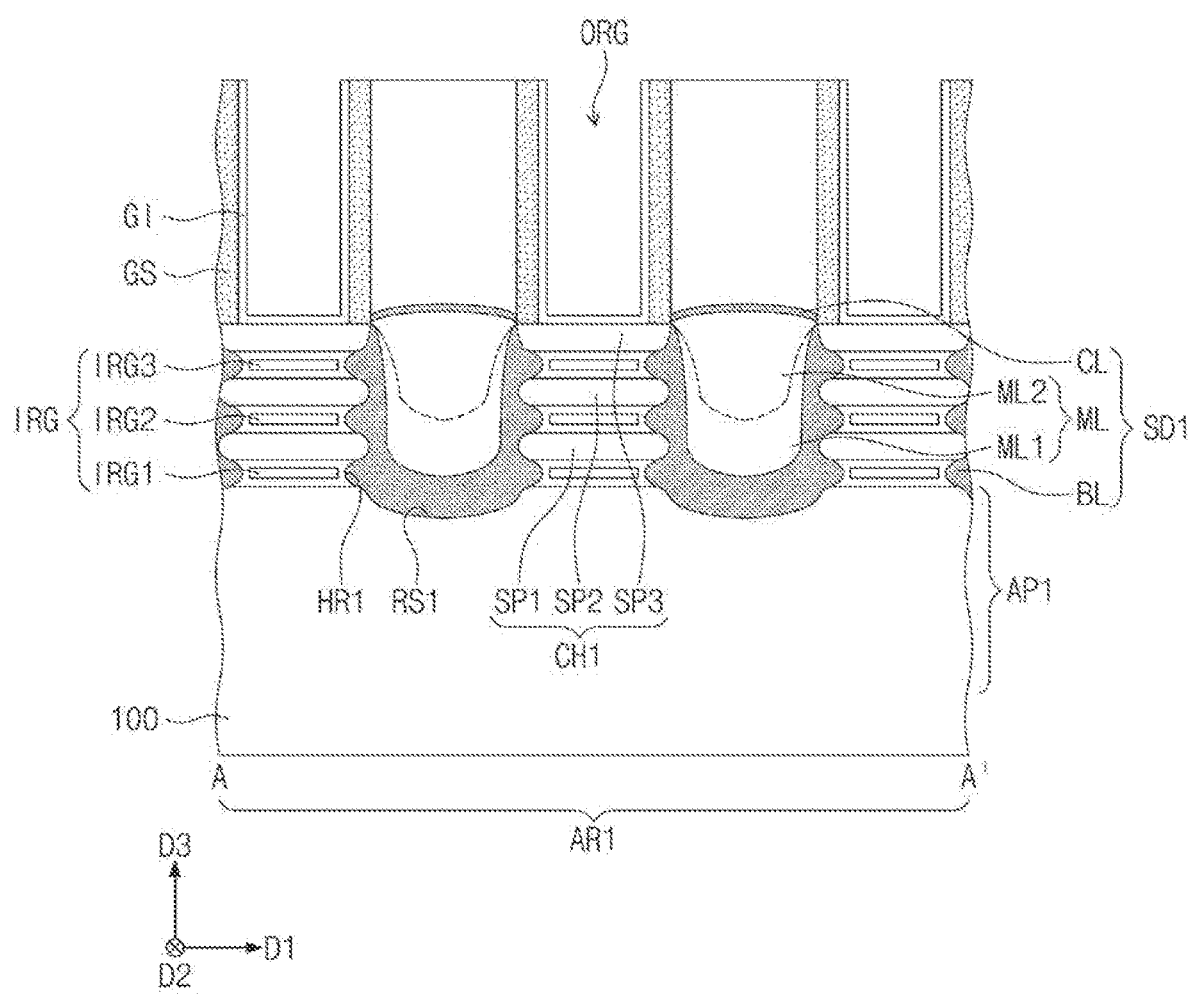
Figure 8B:
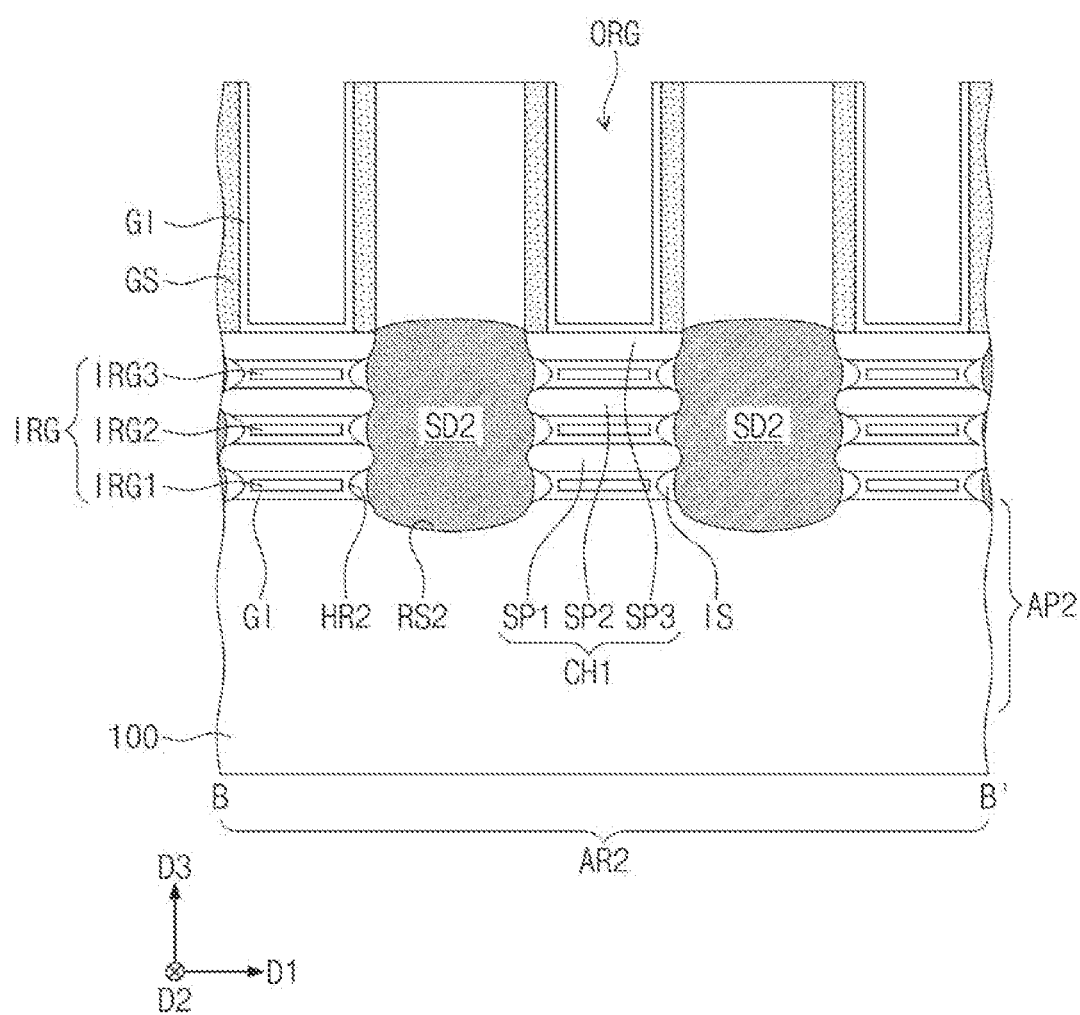
Figure 8C:
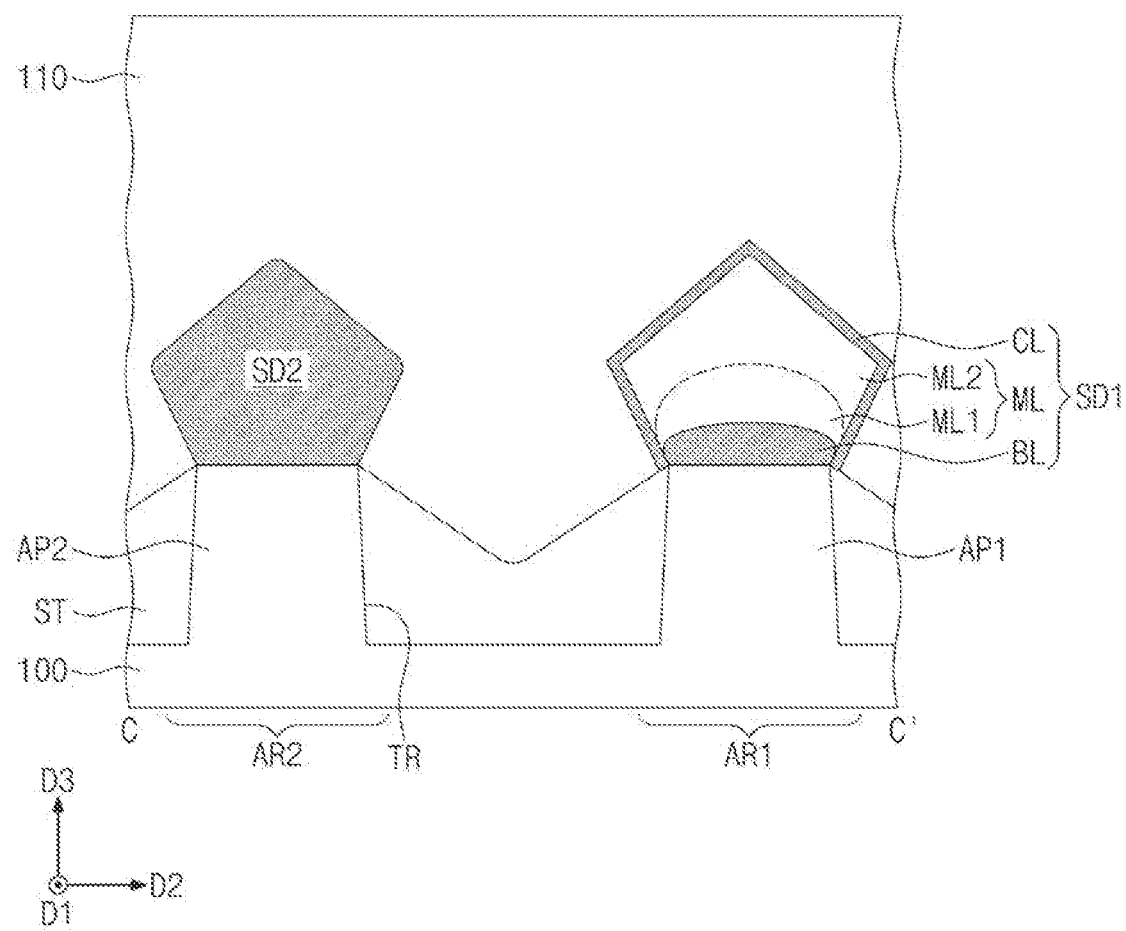
Figure 8D:
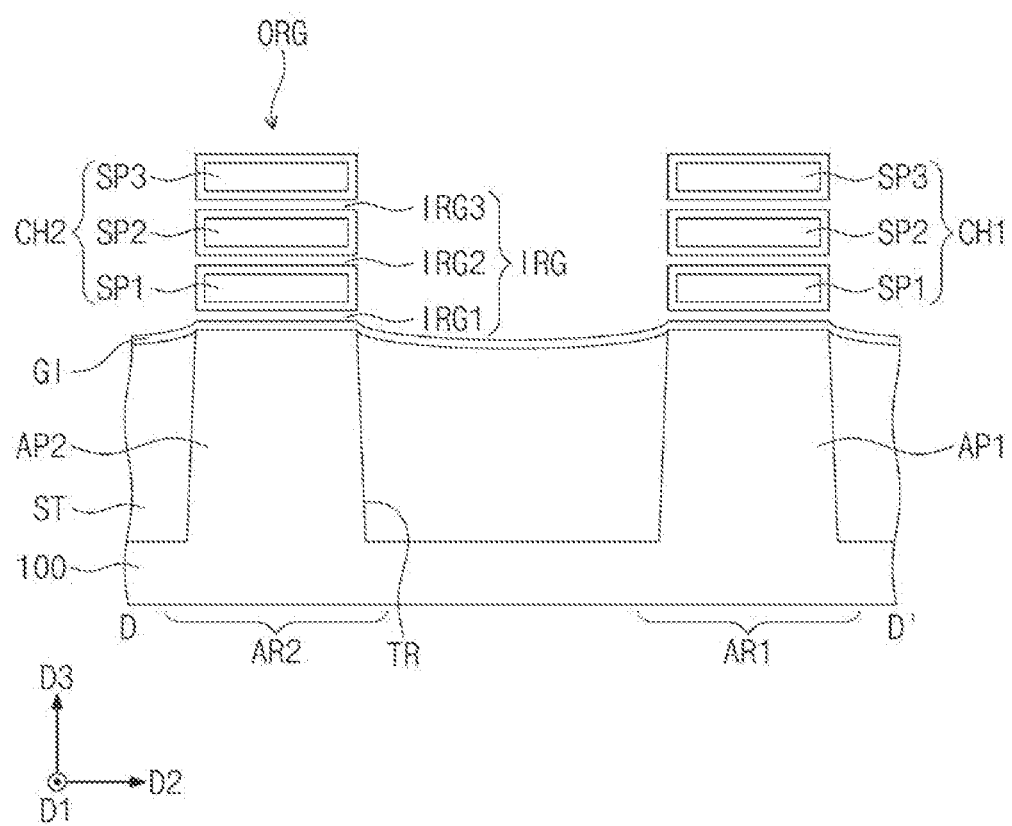

FIGS. 5A, 5B, 6A, 6B, 6D, 7A, 7B, 7C, 8A, 8B, 8C and 8D are cross-sectional views illustrating a method of manufacturing a semiconductor device according to example embodiments. More particularly, FIGS. 5A, 6A, 7A and 8A are cross-sectional views corresponding to the line A-A' of FIG. 1. FIGS. 5A, 6A, 7B and 8B are cross-sectional views corresponding to the line B-B' of FIG. 1. FIGS. 5B, 6B, 7C and 8C are cross-sectional views corresponding to the line C-C' of FIG. 1. FIGS. 5B, 6C and 8D are cross-sectional views corresponding to the line D-D' of FIG. 1. Hereinafter, a method of manufacturing a semiconductor device according to example embodiments will be described with reference to FIGS. 5A to 8D. The descriptions to the same features as mentioned above will be omitted for the purpose of ease and convenience in explanation.

Referring to FIGS. 5A and 5B, a substrate 100 including first and second active regions AR1 and AR2 may be provided. A stack pattern STP including semiconductor layers SL and sacrificial layers SAL which are alternately stacked may be formed on the substrate 100. The stack pattern STP may be formed in plurality, and the stack patterns STP may be provided on the first and second active regions AR1 and AR2, respectively. The stack pattern STP may extend in the first direction D1.

The formation of the stack pattern STP may include alternately stacking the semiconductor layers SL and the sacrificial layers SAL on the substrate 100, forming mask patterns extending in the first direction D1 after the stacking, and performing a patterning process using the mask patterns as etch masks. By the patterning process, the stack patterns STP having shapes corresponding to those of the mask patterns may be formed, and a portion of the substrate 100 may also be etched to form a trench TR. First and second active patterns AP1 and AP2 may be defined on the first and second active regions AR1 and AR2 by the trench TR, respectively.

The semiconductor layers SL may include one of silicon (Si), germanium (Ge) and silicon-germanium (SiGe), and the sacrificial layers SAL may include another (e.g., different from that of the semiconductor layers SL) of silicon (Si), germanium (Ge) and silicon-germanium (SiGe).

The sacrificial layers SAL may include a material having an etch selectivity with respect to the semiconductor layers SL. For example, the semiconductor layers SL may include silicon (Si), and the sacrificial layers SAL may include silicon-germanium (SiGe). For example, a germanium (Ge) concentration in each of the sacrificial layers SAL may range from 10 at % to 30 at %.

Thereafter, a device isolation pattern ST may be formed to fill the trench TR. The formation of the device isolation pattern ST may include forming a device isolation layer filling the trench TR and covering the stack patterns STP, and recessing the device isolation layer below the stack patterns STP to divide the device isolation layer into the device isolation patterns ST. The device isolation pattern ST may include an insulating material (e.g., silicon oxide). The stack patterns STP may vertically protrude above the device isolation pattern ST.

Referring to FIGS. 6A to 6C, sacrificial patterns PP may be formed on the substrate 100 to intersect the stack patterns STP in the second direction D2. Each of the sacrificial patterns PP may be formed to have a line shape or bar shape extending in the second direction D2.

The formation of the sacrificial patterns PP may include forming a sacrificial material layer on an entire top surface of the substrate 100, forming hard mask patterns MP on the sacrificial material layer, and patterning the sacrificial material layer using the hard mask patterns MP as etch masks. By the patterning process, the sacrificial patterns PP may be formed to have shapes corresponding to those of the hard mask patterns MP. The sacrificial patterns PP may include poly-silicon.

A pair of gate spacers GS may be formed on both side surfaces of each of the sacrificial patterns PP. The formation of the gate spacers GS may include forming a gate spacer layer conformally covering the sacrificial patterns PP and the hard mask patterns MP on an entire top surface of the substrate 100, and anisotropically etching the gate spacer layer to form the gate spacers GS. The gate spacer GS may be formed of a multi-layer including at least two layers in example embodiments, but the disclosure are not limited thereto.

First recesses RS1 may be formed in the stack pattern STP on the first active pattern AP1. Second recesses RS2 may be formed in the stack pattern STP on the second active pattern AP2. The formation of the first and second recesses RS1 and RS2 may include etching the stack patterns STP using the hard mask patterns MP and the gate spacers GS as etch masks. Each of the first and second recesses RS1 and RS2 may be formed between a pair of the sacrificial patterns PP when viewed in a plan view.

The semiconductor layers SL of the stack patterns STP may be divided into first channel patterns CH1 and second channel patterns CH2 by the first and second recesses RS1 and RS2, respectively. Each of the first and second channel patterns CH1 and CH2 may include first to third semiconductor patterns SP1, SP2 and SP3. During the formation of the first and second recesses RS1 and RS2, the sacrificial layers SAL may be etched more than the semiconductor layers SL, thereby forming first and second horizontal recesses HR1 and HR2. At this time, an upper portion of the device isolation pattern ST not covered by the sacrificial patterns PP may be more recessed.

Referring to FIGS. 7A to 7C, first source/drain patterns SD1 may be formed in the first recesses RS1, respectively. The first source/drain patterns SD1 may be epitaxial layers formed by performing a SEG process using inner surfaces of the first recesses RS1 as a seed layer. The epitaxial layers may be grown using the first to third semiconductor patterns SP1, SP2 and SP3 and the substrate 100, which are exposed by the first recesses RS1 and the first horizontal recesses HR1, as a seed. For example, the SEG process may include a chemical vapor deposition (CVD) process or a molecular beam epitaxy (MBE) process.

More particularly, a buffer layer BL of the first source/drain pattern SD1 may be first formed. The buffer layer BL may be grown using the first to third semiconductor patterns SP1, SP2 and SP3 and the substrate 100, which are exposed by the first recess RS1 and the first horizontal recesses HR1, as a seed and may cover the inner surface of the first recess RS1. The buffer layer BL may include a semiconductor element (e.g., SiGe) having a lattice constant greater than that of a semiconductor element (e.g., Si) of the substrate 100. A germanium concentration in the buffer layer BL may be lower than that of the sacrificial layer SAL. Thus, the sacrificial layer SAL may have an etch selectivity with respect to the buffer layer BL. For example, the germanium concentration in the buffer layer BL may be greater than 0 at % and may be equal to or less than 10 at %.

A main layer ML may be formed on the buffer layer BL to fill a remaining portion of the first recess RS1. The formation of the main layer ML may include forming a first main layer ML1 covering the buffer layer BL, and forming a second main layer ML2 on the first main layer ML1. The first and second main layers ML1 and ML2 may include the same semiconductor element (e.g., SiGe) as the buffer layer BL. A germanium concentration in the first main layer ML1 may be higher than that in the buffer layer BL and may be lower than that of the second main layer ML2. For example, the germanium concentration in the first main layer ML1 may be equal to or greater than 30 at % and may be equal to or less than 50 at %. For example, the germanium concentration in the second main layer ML2 may be equal to or greater than 50 at % and equal to or less than 60 at % and may be greater than the germanium concentration in the first main layer ML1.

The first, third and fifth regions R1, R3 and R5 of FIG. 3 may be defined in the buffer layer BL, the first main layer ML1 and the second main layer ML2, respectively. A change in germanium concentration according to a position in each of the first, third and fifth regions R1, R3 and R5 may be relatively small.

The second region R2 of FIG. 3 may be defined at a boundary of the buffer layer BL and the first main layer ML1. Germanium of the first main layer ML1 having a relatively high germanium concentration may be diffused to the buffer layer BL to form the second region R2. Thus, a germanium concentration in the second region R2 may become progressively lower toward the first region R1 and may become progressively higher toward the third region R3. A change in germanium concentration according to a position in the second region R2 may be greater than that in each of the first, third and fifth regions R1, R3 and R5.

The fourth region R4 of FIG. 3 may be defined at a boundary of the first main layer ML1 and the second main layer ML2. Germanium of the second main layer ML2 having a relatively high germanium concentration may be diffused to the first main layer ML1 to form the fourth region R4. Thus, a germanium concentration in the fourth region R4 may become progressively lower toward the third region R3 and may become progressively higher toward the fifth region R5. A change in germanium concentration according to a position in the fourth region R4 may be greater than that in each of the first, third and fifth regions R1, R3 and R5.

Thereafter, a capping layer CL may be formed to cover a top surface of the main layer ML. For example, the capping layer CL may conformally cover the main layer ML protruding above the first recess RS1 as illustrated in FIG. 7A, but example embodiments of the disclosure are not limited thereto. The capping layer CL may include the same semiconductor element (e.g., Si) as the substrate 100.

During the formation of the first source/drain pattern SD1, dopants (e.g., boron, gallium or indium) may be injected in-situ to allow the first source/drain pattern SD1 to have a p-type. Alternatively, dopants may be injected into the first source/drain pattern SD1 after the formation of the first source/drain pattern SD1.

Second source/drain patterns SD2 may be formed in the second recesses RS2, respectively. The formation of the second source/drain pattern SD2 may include forming an insulating layer filling the second recess RS2 and the second horizontal recesses HR2, dividing the insulating layer into inner spacers IS by a wet etching process, and performing a SEG process using an inner surface of the second recess RS2 as a seed layer. At this time, the inner spacers IS may not function as a seed, and an epitaxial layer may not be grown on the inner spacers IS. For example, the insulating layer may include at least one of silicon oxide, silicon oxynitride, or silicon nitride. The second source/drain pattern SD2 may be formed before or after the formation of the first source/drain pattern SD1, but example embodiments of the disclosure are not limited thereto.

During the formation of the second source/drain pattern SD2, dopants (e.g., phosphorus, arsenic or antimony) may be injected in-situ to allow the second source/drain pattern SD2 to have an n-type. Alternatively, dopants may be injected into the second source/drain pattern SD2 after the formation of the second source/drain pattern SD2.

Referring to FIGS. 8A to 8D, a first interlayer insulating layer 110 may be formed to cover the first and second source/drain patterns SD1 and SD2, the hard mask patterns MP and the gate spacers GS. For example, the first interlayer insulating layer 110 may include silicon oxide.

The first interlayer insulating layer 110 may be planarized to expose top surfaces of the sacrificial patterns PP. The planarization process may be performed using an etch-back process or a chemical mechanical polishing (CMP) process. The hard mask patterns MP may be completely removed in the planarization process. Thus, a top surface of the first interlayer insulating layer 110 may be substantially coplanar with the top surfaces of the sacrificial patterns PP and top surfaces of the gate spacers GS.

The exposed sacrificial patterns PP may be selectively removed. Outer regions ORG exposing the first and second channel patterns CH1 and CH2 may be formed by the removal of the sacrificial patterns PP. The removal of the sacrificial patterns PP may be performed by a wet etching process using an etching solution capable of selectively etching poly-silicon.

The sacrificial layers SAL exposed through the outer region ORG may be selectively removed to form inner regions IRG. For example, the inner regions IRG may include first to third inner regions IRG1, IRG2 and IRG3 spaced apart from each other in the third direction D3. At this time, due to a high etch selectivity of the sacrificial layers SAL, the first to third semiconductor patterns SP1, SP2 and SP3 and the buffer layer BL may not be etched but may remain. The etching process may be a wet etching process. The first to third semiconductor patterns SP1, SP2 and SP3 may be exposed through the outer region ORG and the inner regions IRG.

A gate insulating pattern GI may be formed on the exposed first to third semiconductor patterns SP1, SP2 and SP3. The gate insulating pattern GI may be formed to surround each of the first to third semiconductor patterns SP1, SP2 and SP3. The gate insulating pattern GI may be formed in the inner regions IRG and the outer region ORG.

Referring to FIGS. 2A to 2D, a gate electrode GE may be formed on the gate insulating pattern GI. The gate electrode GE may include first to third electrode patterns EP1, EP2 and EP3 formed in the first to third inner regions IRG1, IRG2 and IRG3, respectively, and a fourth electrode pattern EP4 formed in the outer region ORG. An upper portion of the fourth electrode pattern EP4 may be recessed, and thus a height of the fourth electrode pattern EP4 may be lower than those of the gate spacers GS. A gate capping pattern GC may be formed on the recessed fourth electrode pattern EP4.

A second interlayer insulating layer 120 may be formed on the first interlayer insulating layer 110 and the gate capping pattern GC. The second interlayer insulating layer 120 may include silicon oxide. Active contacts AC may penetrate the first and second interlayer insulating layers 110 and 120 so as to be connected to the first and second source/drain patterns SD1 and SD2, respectively. The formation of the active contacts AC may include forming a barrier pattern BM and forming a conductive pattern CP on the barrier pattern BM. The barrier pattern BM may be conformally formed. An ohmic pattern OM may be formed between each of the active contacts AC and a corresponding source/drain pattern SD1 or SD2.

A third interlayer insulating layer 130 may be formed on the second interlayer insulating layer 120 and the active contacts AC. The third interlayer insulating layer 130 may include silicon oxide. Metal patterns MT and vias VIA may be formed in the third interlayer insulating layer 130.

Figure 9:
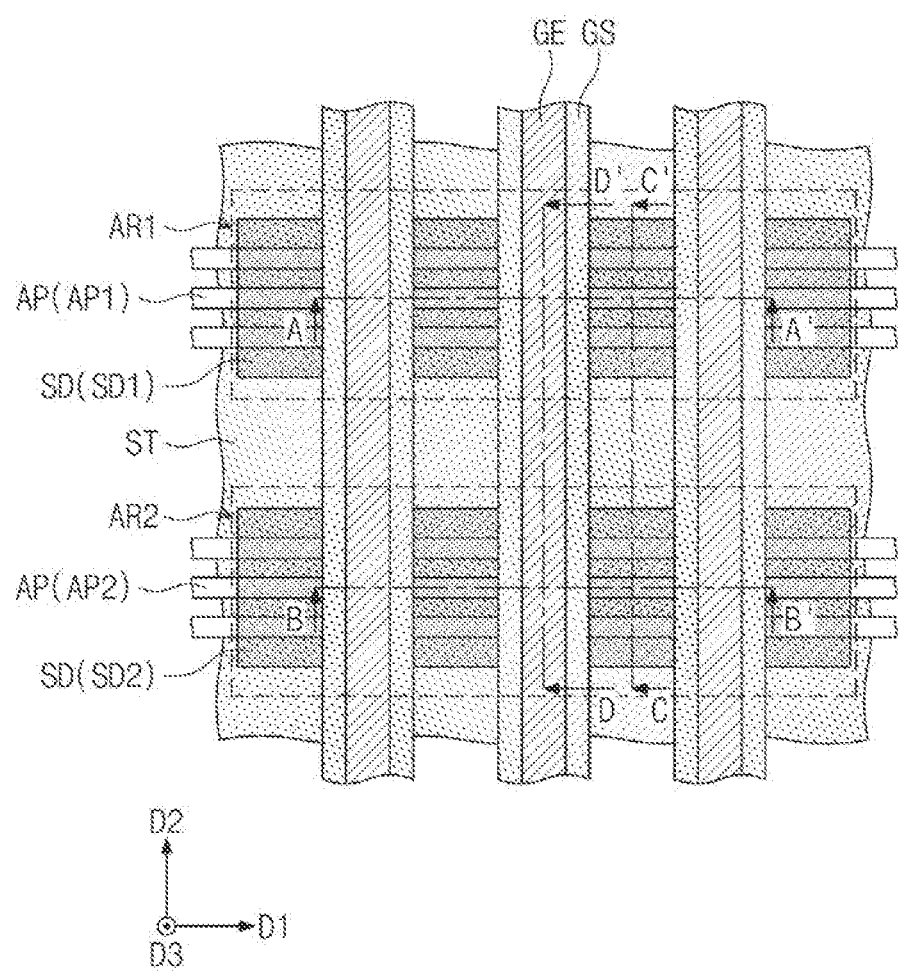
FIG. 9 is a diagram illustrating a semiconductor device according to example embodiments.

FIG. 9 is a diagram illustrating a semiconductor device according to example embodiments. FIGS. 10A, 10B, 10C and 10D are cross-sectional views taken along lines A-A', B-B', C-C' and D-D' of FIG. 9, respectively according to example embodiments. Hereinafter, the descriptions to the same features as mentioned above will be omitted for the purpose of ease and convenience in explanation.

Figure 10A:
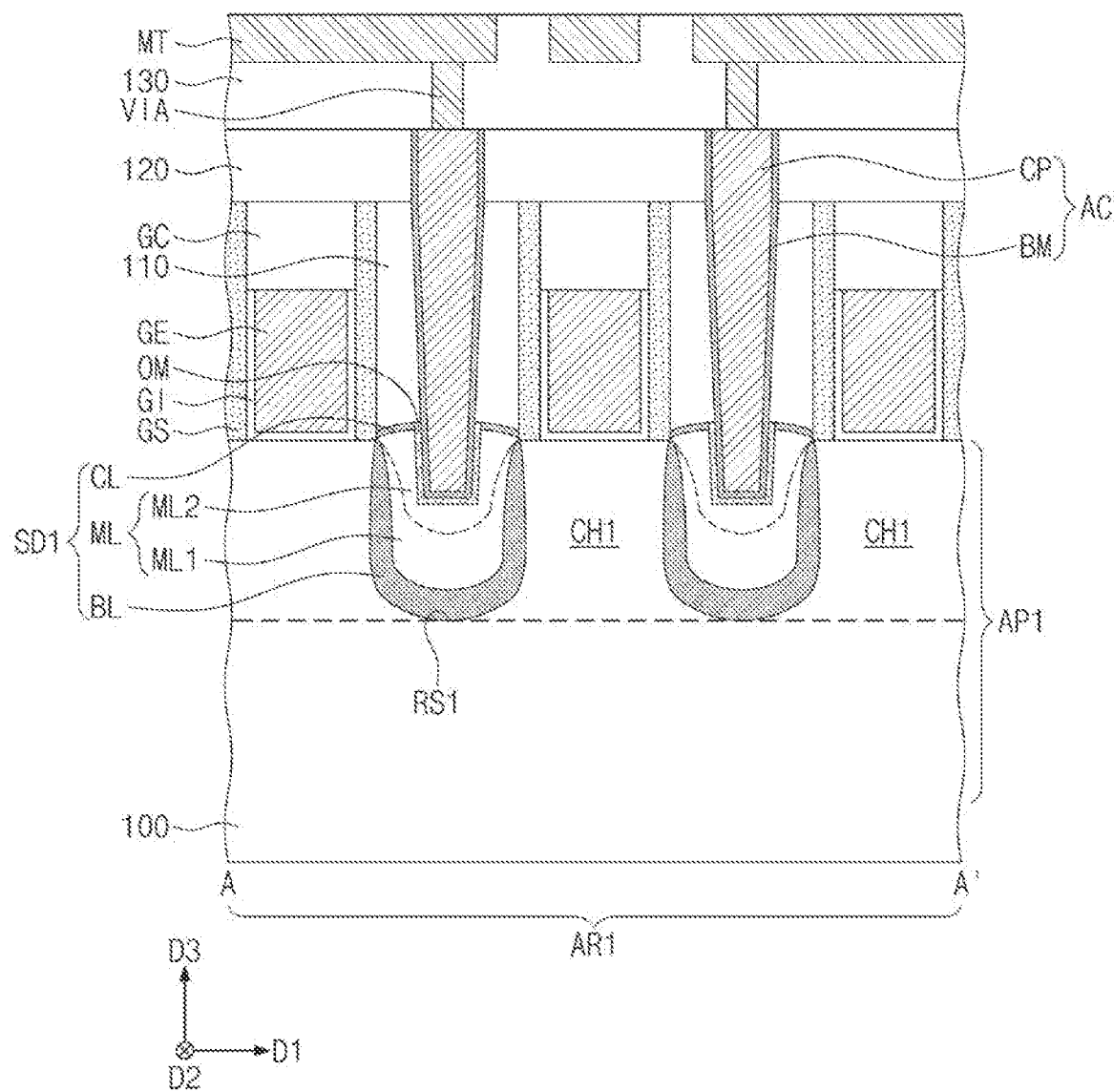
FIGS. 10A, 10B, 10C and 10D are cross-sectional views taken along lines A-A', B-B', C-C' and D-D' of FIG. 9, respectively, according to example embodiments.
Figure 10B:
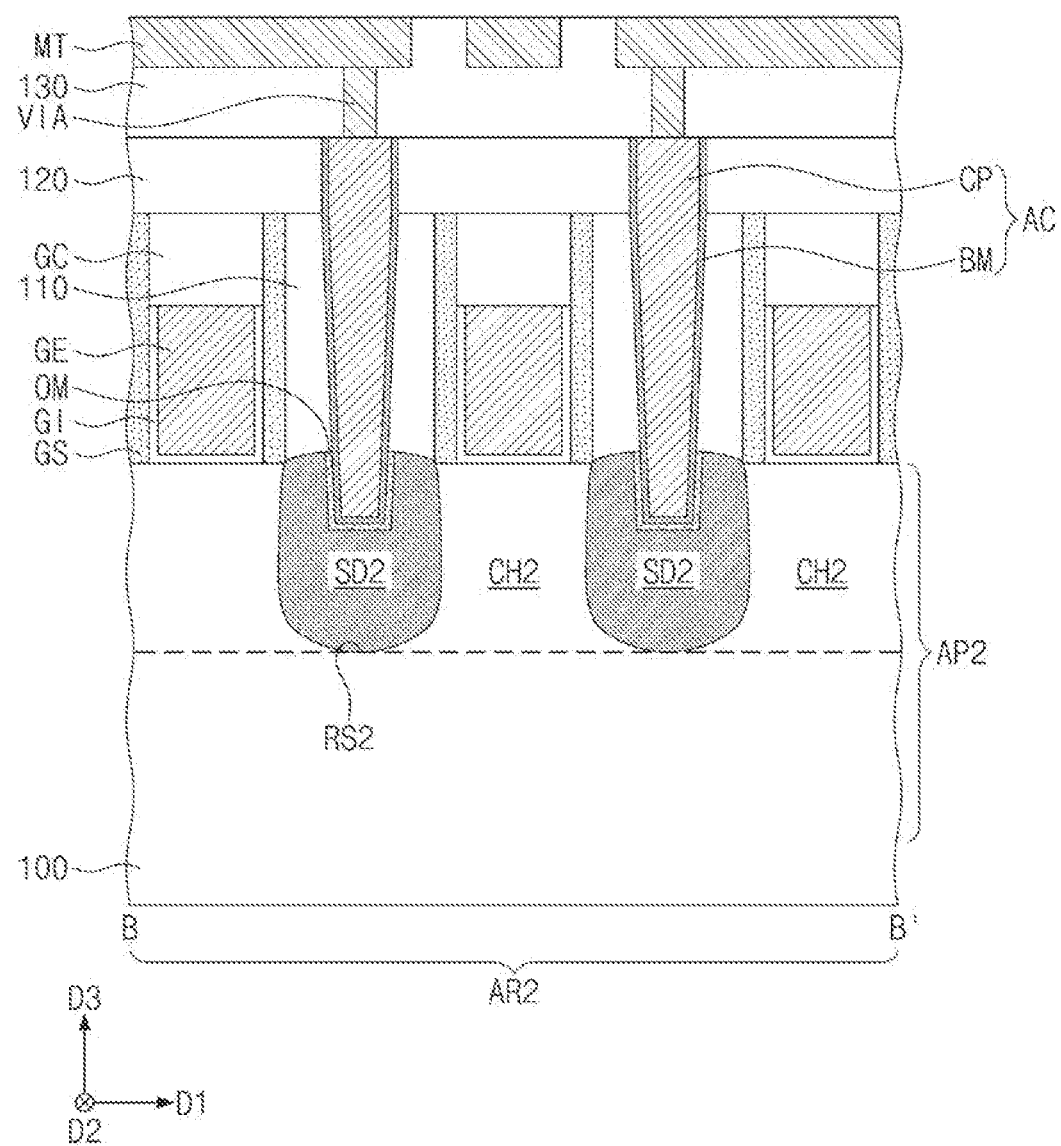
Figure 10C:
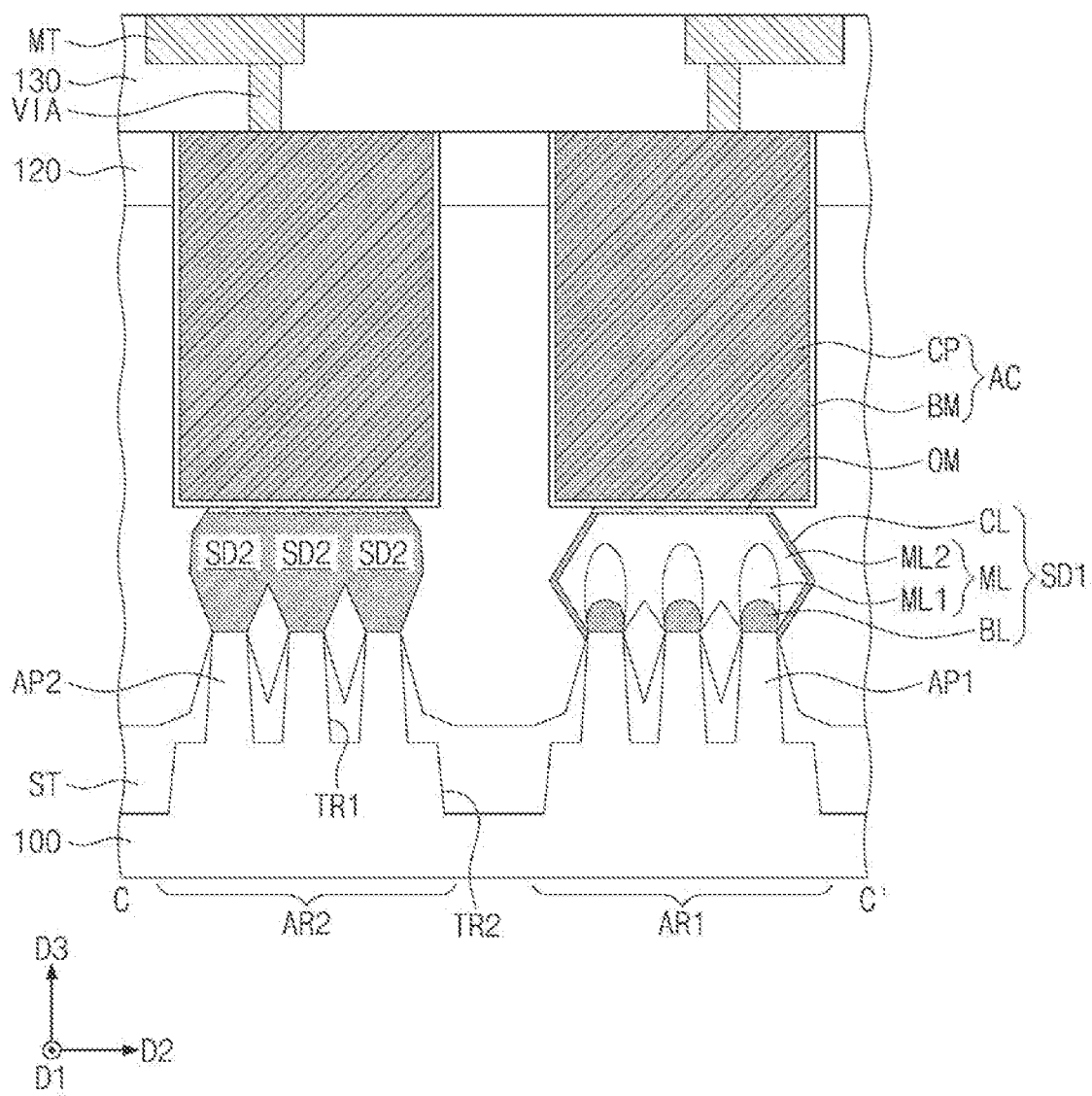
Figure 10D:
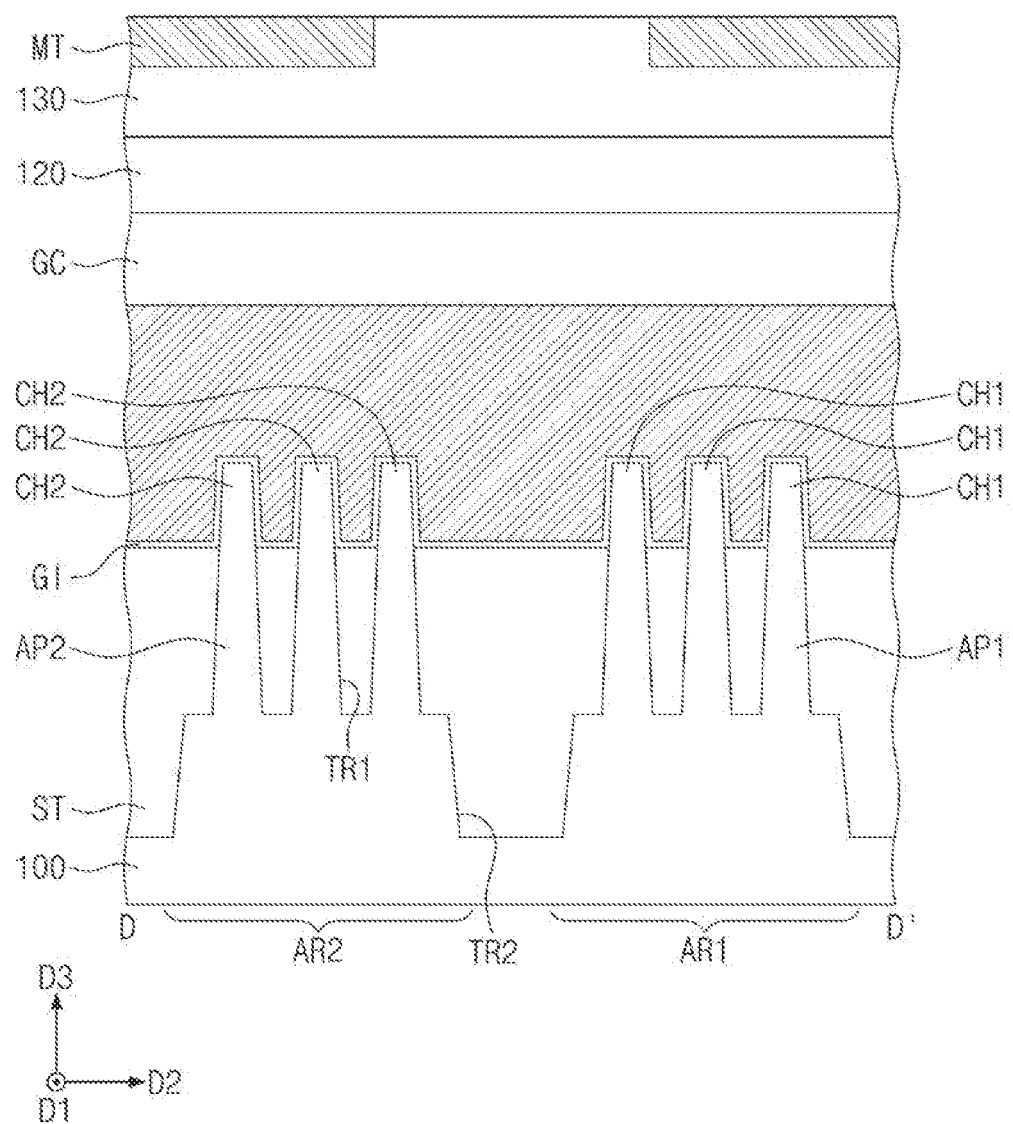

Referring to FIGS. 9 through 10D, transistors according to the present embodiments may be three-dimensional field effect transistors (e.g., FinFETs) in which first and second channel patterns CH1 and CH2 have fin shapes.

More particularly, a substrate 100 including a first active region AR1 and a second active region AR2 may be provided. The first and second active regions AR1 and AR2 may be defined by a second trench TR2 in an upper portion of the substrate 100. First active patterns AP1 and second active patterns AP2 may be provided on the first active region AR1 and the second active region AR2, respectively. The first and second active patterns AP1 and AP2 may be portions of the substrate 100, which vertically protrude. First trenches TR1 may be defined between the first active patterns AP1 adjacent to each other and between the second active patterns AP2 adjacent to each other. The first trench TR1 may be shallower than the second trench TR2.

A device isolation pattern ST may fill the first and second trenches TR1 and TR2. The device isolation pattern ST may include silicon oxide. Upper portions of the first and second active patterns AP1 and AP2 may vertically protrude above the device isolation pattern ST.

First source/drain patterns SD1 may be provided in upper portions of the first active patterns AP1. The first source/drain patterns SD1 may be dopant regions having a first conductivity type (e.g., a p-type). A first channel pattern CH1 may be disposed between a pair of the first source/drain patterns SD1. The first source/drain patterns SD1 may be provided in first recesses RS1 between the first channel patterns CH1.

Second source/drain patterns SD2 may be provided in upper portions of the second active patterns AP2. The second source/drain patterns SD2 may be dopant regions having a second conductivity type (e.g., an n-type). A second channel pattern CH2 may be disposed between a pair of the second source/drain patterns SD2. The second source/drain patterns SD2 may be provided in second recesses RS2 between the second channel patterns CH2.

The first and second source/drain patterns SD1 and SD2 may include epitaxial patterns formed by a selective epitaxial growth (SEG) process. For example, top surfaces of the first and second source/drain patterns SD1 and SD2 may be substantially coplanar with top surfaces of the first and second channel patterns CH1 and CH2. Alternatively, the top surfaces of the first and second source/drain patterns SD1 and SD2 may be higher than the top surfaces of the first and second channel patterns CH1 and CH2.

In example embodiments, the first source/drain patterns SD1 may include a semiconductor element (e.g., SiGe) of which a lattice constant is greater than a lattice constant of a semiconductor element of the substrate 100. Thus, the pair of first source/drain patterns SD1 may provide compressive stress to the first channel pattern CH1 therebetween. The second source/drain patterns SD2 may include the same semiconductor element (e.g., Si) as the substrate 100.

The first source/drain pattern SD1 may include a buffer layer BL, a main layer ML, and a capping layer CL. The buffer layer BL may cover an inner surface of the first recess RS1. The main layer ML may cover the buffer layer BL and may fill a portion of the first recess RS1. The capping layer CL may cover a top surface of the main layer ML. For example, the capping layer CL may conformally cover the main layer ML protruding above the first recess RS1 as illustrated in FIG. 10A, but the disclosure are not limited thereto. The main layer ML may include a first main layer ML1 adjacent to the buffer layer BL, and a second main layer ML2 between the first main layer ML1 and the capping layer CL.

The buffer layer BL and the main layer ML may include a semiconductor element of which a lattice constant is greater than that of the semiconductor element of the substrate 100. For example, the substrate 100 may include silicon (Si), and the buffer layer BL and the main layer ML may include silicon-germanium (SiGe). A lattice constant of germanium may be greater than a lattice constant of silicon. The capping layer CL may include the same semiconductor element (e.g., Si) as the substrate 100. In example embodiments, due to a diffusion phenomenon of an element in the main layer ML, the capping layer CL may further include the same element as the main layer ML.

The first source/drain pattern SD1 may include first to fifth regions R1, R2, R3, R4 and R5, like the first source/drain pattern SD1 of FIG. 3. Positions and germanium concentrations of the regions R1 to R5 may be substantially the same as the features of the first source/drain pattern SD1 of FIG. 3. Thus, a change in germanium concentration over levels in the first source/drain pattern SD1 may also be shown as FIG. 4. For example, the change in germanium concentration in the first source/drain pattern SD1 may have a step-shaped profile (e.g., in direction D3).

A gate electrode GE may intersect the first and second channel patterns CH1 and CH2. A plurality of gate electrodes GE may be provided. The plurality of gate electrodes GE may extend in the second direction D2 and may be spaced apart from each other in the first direction D1. The gate electrode GE may vertically overlap with the first and second channel patterns CH1 and CH2. The gate electrode GE may surround a top surface and both side surfaces of each of the first and second channel patterns CH1 and CH2.

A pair of gate spacers GS may be disposed on both side surfaces of the gate electrode GE. The gate spacers GS may extend in the second direction D2 along the gate electrode GE. A gate capping pattern GC may be provided on the gate electrode GE. The gate capping pattern GC may extend in the second direction D2 along the gate electrode GE. A gate insulating pattern GI may be disposed between the gate electrode GE and the first channel pattern CH1 and between the gate electrode GE and the second channel pattern CH2. The gate insulating pattern GI may cover a top surface of the device isolation pattern ST under the gate electrode GE.

A first interlayer insulating layer 110 may be provided on the substrate 100. The first interlayer insulating layer 110 may cover the gate spacers GS and the first and second source/drain patterns SD1 and SD2. A second interlayer insulating layer 120 may be disposed on the first interlayer insulating layer 110 to cover the gate capping pattern GC. A third interlayer insulating layer 130 may be provided on the second interlayer insulating layer 120.

An active contact AC may penetrate the first and second interlayer insulating layers 110 and 120 along the third direction D3. A plurality of active contacts AC may be provided, and each of the plurality of active contacts AC may be connected to a corresponding one of the first and second source/drain patterns SD1 and SD2. A lower portion of each of the active contacts AC may be buried in an upper portion of the corresponding source/drain pattern SD1 or SD2. The active contact AC may include a conductive pattern CP and a barrier pattern BM surrounding the conductive pattern CP. An ohmic pattern OM may be disposed between the active contact AC and the corresponding source/drain pattern SD1 or SD2. Metal patterns MT may be provided in the third interlayer insulating layer 130. Vias VIA may connect the metal patterns MT to the active contacts AC.

According to example embodiments, an intermediate layer may be skipped. Thus, a germanium concentration may be shown in a step form. As a result, manufacturing processes may be simplified, and compressive stress applied to channels may be increased to increase mobility of holes. Whether the intermediate layer is skipped may be checked by component analysis.

According to the disclosure, the processes of forming the source/drain pattern of the semiconductor device may be simplified, and thus the semiconductor device may be easily manufactured.

In addition, the compressive stress provided to the channel pattern by the source/drain pattern may be increased to increase the mobility of holes, and thus the electrical characteristics of the semiconductor device may be improved.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor device comprising:
a substrate comprising an active pattern;
a channel pattern on the active pattern; and
a source/drain pattern on a side surface of the channel pattern, the source/drain pattern comprising:
a first section between a first level and a second level that is higher than the first level;
a first variation section between the second level and a third level that is higher than the second level; and
a second section between the third level and a fourth level that is higher than the third level,
wherein a rate of change in germanium concentration in the first variation section in a first direction is greater than a rate of change in germanium concentration in each of the first section and the second section in the first direction, and
wherein a germanium concentration at each of the first level and the second level is greater than 0 at % and equal to or less than 10 at %.

2. The semiconductor device of claim 1, wherein a germanium concentration in the first section is greater than 0 at % and equal to or less than 10 at %.

3. The semiconductor device of claim 1, wherein a difference between a germanium concentration at the third level and a germanium concentration at the fourth level is 10 at % or less.

4. The semiconductor device of claim 1, wherein a germanium concentration at each of the third level and the fourth level is equal to or greater than 30 at % and equal to or less than 50 at %.

5. The semiconductor device of claim 1, wherein a germanium concentration in the second section is equal to or greater than 30 at % and equal to or less than 50 at %.

6. The semiconductor device of claim 1, wherein a rate of change in germanium concentration from the second level to the third level in the first direction is equal to or greater than 6 at %/nm and equal to or less than 10 at %/nm.

7. The semiconductor device of claim 1, wherein the source/drain pattern further comprises:
a second variation section between the fourth level and a fifth level that is higher than the fourth level; and
a third section between the fifth level and a sixth level that is higher than the fifth level,
wherein a rate of change in germanium concentration in the second variation section in the first direction is greater than the rate of change in germanium concentration in the third section.

8. The semiconductor device of claim 7, wherein the rate of change in germanium concentration in the second variation section in the first direction is greater than the rate of change in germanium concentration in each of the first section and the second section in the first direction.

9. The semiconductor device of claim 7, wherein a difference between a germanium concentration at the fifth level and a germanium concentration at the sixth level is 10 at % or less.

10. The semiconductor device of claim 7, wherein a germanium concentration at each of the fifth level and the sixth level is equal to or greater than 50 at % and equal to or less than 60 at %.

11. The semiconductor device of claim 7, wherein a germanium concentration in the third section is equal to or greater than 50 at % and equal to or less than 60 at %.

12. The semiconductor device of claim 7, wherein a rate of change in germanium concentration from the fourth level to the fifth level in the first direction is equal to or greater than 6 at %/nm and equal to or less than 10 at %/nm.

13. A semiconductor device comprising:
a substrate comprising an active pattern;
a channel pattern on the active pattern; and
a source/drain pattern on a side surface of the channel pattern, the source/drain pattern comprising a first variation section, and
wherein a rate of change in germanium concentration in the first variation section in a first direction is equal to or greater than 6 at %/nm and equal to or less than 10 at %/nm,
wherein the source/drain pattern further comprises:
a first section below the first variation section; and
a second section on the first variation section, and
wherein the rate of change in germanium concentration in the first variation section in the first direction is greater than a rate of change in germanium concentration in each of the first section and the second section in the first direction.

14. The semiconductor device of claim 13, wherein a germanium concentration in the first section is greater than 0 at % and equal to or less than 10 at %.

15. The semiconductor device of claim 13, wherein a germanium concentration in the second section is equal to or greater than 30 at % and equal to or less than 50 at %.

16. The semiconductor device of claim 13, wherein the source/drain pattern further comprises a second variation section on the second section, and
wherein a rate of change in germanium concentration in the second variation section in the first direction is equal to or greater than 6 at %/nm and equal to or less than 10 at %/nm.

17. The semiconductor device of claim 16, wherein the source/drain pattern further comprises a third section on the second variation section, and wherein a germanium concentration in the third section is equal to or greater than 50 at % and equal to or less than 60 at %.

18. A semiconductor device comprising:

a substrate comprising an active pattern;

a device isolation pattern surrounding the active pattern;

a channel pattern comprising:

a first semiconductor pattern, a second semiconductor pattern, and a third semiconductor pattern, each of the first semiconductor pattern, the second semiconductor pattern and the third semiconductor pattern being spaced apart from each other and being sequentially stacked on the active pattern;

a gate electrode on the first semiconductor pattern, the second semiconductor pattern and the third semiconductor pattern;

a gate insulating pattern between the gate electrode and the first semiconductor pattern, the second semiconductor pattern and the third semiconductor pattern;

a gate spacer on a side surface of the gate electrode;

a gate capping pattern on a top surface of the gate electrode; and a source/drain pattern connected to the first semiconductor pattern, the second semiconductor pattern and the third semiconductor pattern, the source/drain pattern comprising:

a first section between a first level and a second level that is higher than the first level;

a first variation section between the second level and a third level that is higher than the second level; and a second section between the third level and a fourth level that is higher than the third level, wherein a rate of change in germanium concentration in the first variation section in a first direction is greater than a rate of change in germanium concentration in each of the first section and the second section in the first direction, and wherein a thickness of the first variation section is less than a thickness of the second section.

19. The semiconductor device of claim 18, wherein a rate of change in germanium concentration from the second level to the third level in the first direction is equal to or greater than 6 at %/nm and equal to or less than 10 at %/nm.

* * * * *